United States Patent
Paris et al.

(10) Patent No.: US 10,044,369 B1
(45) Date of Patent: Aug. 7, 2018

(54) INTERLEAVED CODES FOR DYNAMIC SIZEABLE HEADERS

(71) Applicant: Centri Technology, Inc., Seattle, WA (US)

(72) Inventors: Luis Gerardo Paris, Maple Valley, WA (US); Michael Patrick Mackey, Lake Stevens, WA (US)

(73) Assignee: Centri Technology, Inc., Seattle, WA (US)

( * ) Notice: Subject to any disclaimer, the term of this patent is extended or adjusted under 35 U.S.C. 154(b) by 0 days.

(21) Appl. No.: 15/924,137

(22) Filed: Mar. 16, 2018

(51) Int. Cl.
*H03M 7/40* (2006.01)
*H03M 7/30* (2006.01)

(52) U.S. Cl.
CPC ........... *H03M 7/40* (2013.01); *H03M 7/3084* (2013.01)

(58) Field of Classification Search
CPC ........ H03M 7/40; H03M 7/3084; H03M 7/30; H03M 7/00
USPC ................................. 341/50, 51, 65, 67, 107
See application file for complete search history.

(56) References Cited

U.S. PATENT DOCUMENTS

| | | | | |
|---|---|---|---|---|
| 5,351,047 A * | 9/1994 | Behlen | ................... | G06T 9/005 341/67 |
| 5,798,719 A * | 8/1998 | Wise | ................... | G06F 12/0207 341/65 |
| 7,535,387 B1 * | 5/2009 | Delva | ................... | H03M 7/4006 341/107 |
| 7,559,007 B1 * | 7/2009 | Wilkie | .............. | H03M 13/1515 714/790 |
| 8,522,119 B2 * | 8/2013 | Dick | ..................... | H04L 1/0051 341/94 |
| 2016/0139242 A1 * | 5/2016 | Dupray | ................... | G01S 1/026 455/456.1 |

* cited by examiner

*Primary Examiner* — Jean B Jeanglaude
(74) *Attorney, Agent, or Firm* — John W. Branch; Lowe Graham Jones PLLC

(57) ABSTRACT

Embodiments are directed towards efficient variable length encoding and decoding of numerical data sets using new interleaved start-step codes. The proposed codes minimize the space required to represent and store numerical values in data intensive applications. Efficient implementations are possible at higher processing speeds and reduced code size than current state-of-the-art codes. Encoding engines select one of a plurality of numerical values from an input stream. The encoding engines convert each numerical value into a codeword. Each codeword consists of a plurality of data bits interleaved with a group of control bits. The encoding engines provide each codeword to an encoded stream. Decoding engines select one of a plurality of codewords from an encoded stream. The decoding engines convert each codeword into a numerical value. The decoding engines provide each codeword to an output stream. Interleaved codes can add intrinsic value to Blockchain applications and the Internet of Things (IoT).

30 Claims, 15 Drawing Sheets

| i | $C_i$ = start + i * step | Codewords(3,2,∞) | Count | Range of integers |
|---|---|---|---|---|
| 0 | 3 | xxx1 | $2^3 = 8$ | 0 - 7 |
| 1 | 5 | xxx0xx1 | $2^5 = 32$ | 8 - 39 |
| 2 | 7 | xxx0xx0xx1 | $2^7 = 128$ | 40 - 167 |
| 3 | 9 | xxx0xx0xx0xx1 | $2^9 = 512$ | 168-679 |
| 4 | 11 | xxx0xx0xx0xx0xx1 | $2^{11} = 2048$ | 680-2,727 |
| ... | ... | xxx0xx0xx0...xx0xx1 | ... | ... |

INTERLEAVED CODES FOR DYNAMIC SIZEABLE HEADERS

TECHNICAL FIELD

The invention relates generally to encoding and decoding of data streams, and more particularly, but not exclusively to encoding and decoding of variable length data streams.

BACKGROUND

Computers typically represent numerical quantities using a fixed number of binary digits, such that, for example, the number two and the number two billion are both represented with 32 bits of data. Fixed length schemes simplify data loads, stores, and numerical computations between computer components and systems. They also facilitate the design and implementation of data structures, encoding and decoding of fields within digital streams, and random access of elements in a collection. Unfortunately, fixed length numbers also waste valuable space during storage and transmission. Variable-length codes have been created to work around this space inefficiency. One common variable length scheme is Huffman coding, but other schemes exist, such as Arithmetic coding, Start-Step-Stop coding, etc. Huffman and Arithmetic coding both achieve optimal code lengths but are relatively slow. Start-Step-Stop coding can be set up to achieve decent code lengths on average, and can be processed in much less time, particularly on resource constrained devices. However, Start-Step-Stop coding still requires significant processing power, and is limited by having an upper bound on the number of integers that can be represented. Thus, it is with respect to these considerations and others that the subject innovations have been made.

BRIEF DESCRIPTION OF THE DRAWINGS

Non-limiting and non-exhaustive embodiments of the present innovations are described with reference to the following drawings. In the drawings, like reference numerals refer to like parts throughout the various figures unless otherwise specified. For a better understanding of the described innovations, reference will be made to the following Detailed Description of Various Embodiments, which is to be read in association with the accompanying drawings, wherein.

DETAILED DESCRIPTION OF THE INVENTION

Figure 1:
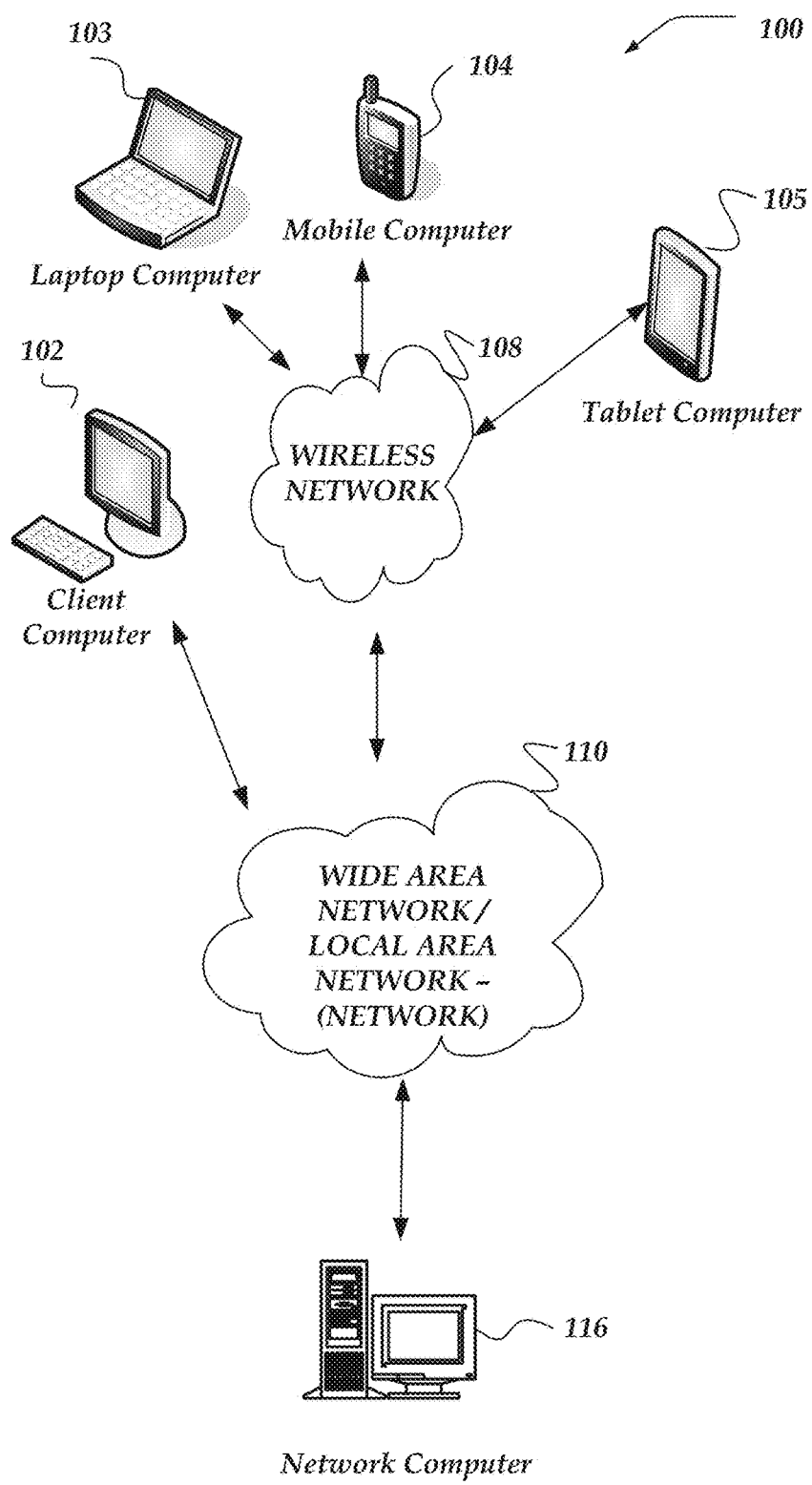
FIG. 1 is a system diagram of an environment in which embodiments of the invention may be implemented.

Various embodiments now will be described more fully hereinafter with reference to the accompanying drawings, which form a part hereof, and which show, by way of illustration, specific exemplary embodiments by which these innovations may be practiced. The embodiments may, however, be embodied in many different forms and should not be construed as limited to the embodiments set forth herein; rather, these embodiments are provided so that this disclosure will be thorough and complete, and will fully convey the scope of the embodiments to those skilled in the art. Among other things, the various embodiments may be methods, systems, media, computers, or devices. Accordingly, the various embodiments may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. Also, throughout the specification and the claims, the use of "when" and "responsive to" do not imply that associated resultant actions are required to occur immediately or within a particular time period. Instead they are used herein to indicate actions that may occur or be performed in response to one or more conditions being met, unless the context clearly dictates otherwise. In addition, throughout the specification, the meaning of "a," "an," and "the" include plural references. The meaning of "in" includes "in" and "on."

For example, embodiments, the following terms are also used herein according to the corresponding meaning, unless the context clearly dictates otherwise.

As used herein "engine" refers to logic embodied in hardware or software instructions, which can be written in a programming language, such as C, C++, Objective-C, COBOL, JAVA™ PHP, Perl, HTML, CSS, JavaScript, Ruby, VBScript, ASPX, Microsoft.NET™ languages such as C#, and/or the like. An engine may be compiled into executable programs or written in interpreted programming languages. Software engines may be callable from other engines or from themselves. Engines described herein refer to one or more logical modules that can be merged with other engines or applications, or can be divided into sub-engines. The engines can be stored in non-transitory computer-readable medium or computer storage device and be stored on and executed by one or more general purpose computers, thus creating a special purpose computer configured to provide the engine.

As used herein "source symbol" refers an integer, character, blob of binary data, or the like, to be encoded. Similarly, "source symbols" refers to a series of integers, characters, binary data, or the like, to be encoded. In the context of encoding, one or more source symbols may also be referred to as "input data".

As used herein "value" refers to an integer value of a source symbol. When a source symbol is an integer, the "source symbol" and the "value" are the same. Other types of source symbols, such as characters, may have an implicit "value"—e.g. the character "A" may have a value of 65. "Values" are converted to (and from) "rawcodes" when encoding (and decoding).

As used herein "output symbol" refers to an integer, character, blob of binary data, or the like, that has been decoded from a codeword. In the context of decoding symbols, one or more output symbols may also be referred to as "output data". "Input data" and "output data", referring to the input of an encoding operation and an output of a decoding operation, respectively, should not be confused with "data bits", which refers to the portion of a codeword that encodes the value source symbol.

As used herein "encoding" refers to converting one or more source symbols from an un-encoded form into an encoded form. One purpose of encoding source symbols as described herein is to reduce the amount of storage capacity (i.e. bits, bytes, etc.) necessary to represent the source symbols. Source symbols may be encoded for purposes of storage, transmission, processing, or the like.

As used herein "decoding" refers to converting one or more source symbols from an encoded form into an un-encoded form. One purpose of decoding source symbols as described herein is to process, transmit, or otherwise use the encoded source symbols.

As used herein "codeword" refers to a coded representation of a source symbol. In particular, a "codeword" encoded by an interleaved start-step code comprises "data bits" interleaved with "control bits". For example, the codeword "xx0xx0xx1" has six data bits represented by six x's, and three control bits represented by 0, 0, and 1.

As used herein, "0b" is a prefix used to indicate a binary number. For example, the number "0b100" is the binary equivalent of 4.

As used herein "rawcode" refers to the encoded representation of a source symbol. A rawcode may be interleaved with control bits to create a codeword. Bits in a codeword derived from a rawcode are referred to as "data bits". For example, the codeword "xx0xx0xx1" has a rawcode of "xxxxxx" (and control bits of "001"). In general, the codeword "xx0xx0 . . . xx0xx1" has a rawcode of "xxxx . . . xxxx", and control bits of "00 . . . 01".

As used herein "data bit" refers to the portion of a codeword that is derived from the rawcode. For example, each "x" in the codeword "xx0xx0xx1" is a data bit. Data bits can be concatenated to reconstitute a rawcode.

As used herein "control bit" refers to a bit in a codeword that determines if additional data bits follow, or if the end of the codeword has been reached. In this way, taken together, the control bits of a codeword define how many data bits are included in that codeword. In one or more of the various embodiments, a control bit of '0' indicates that additional data bits follow, while a control bit of '1' indicates that the end of the codeword has been reached. Alternatively, a '1' may be used to indicate additional data bits follow while a '0' indicates the end of the codeword. It may seem that the choice is arbitrary, but when additional processing is to be performed on the output stream, and it is known that a larger number of 0's or 1's is advantageous for that additional processing, the choice can have performance consequences.

As used herein "shape" of a codeword refers to the pattern of data and control bits defined by a given interleaved start-step code. For example, an ISS of (2,3) has a shape of "xx0xxx0 . . . xxx0xxx1", in which two data bits precede the first control bit and the remaining data bits appear in groups of 3. An ISS code may have 0 start bits, such as an ISS of (0,1), in which case the shape of the codeword would be "0x0 . . . x0x1".

As used herein "unary coding" refers to a variable length encoding that represents a natural number, n, with n ones followed by a zero. A unary coding uses a different length encoding for every source symbol.

As used herein "offset constant" refers to a number constant specific to a particular ISS code used to transform a value into a rawcode and/or a rawcode into a value. For example, a value of 17, encoded using an ISS of (2,2), falls within the range of integers 4-19, and as such has an offset constant k2 of "0b100" (4 in decimal). Thus, the rawcode=value−k2=0b1101 (13 in decimal). As discussed below, the offset constant k1 (the two's complement of k2) could be used in a related equation to arrive at the same result.

As used herein "entropy", when applied to a set of source symbols, refers to the average amount of information contained within the set of source symbols. A set of source symbols with low entropy can be losslessly encoded with fewer bits per source symbol than a set of source symbols with comparatively higher entropy. When applied to a particular source symbol, "entropy" refers to the negative logarithm of the number of bits used to represent that source symbol. As such, symbols with more bits carry more information than a source symbol that has fewer bits.

As used herein "variable-length encoding" refers to an encoding in which source symbols are mapped to a variable number of bits. Variable-length encoding is in contrast to fixed-length encoding, in which each source symbol is encoded using the same number of bits. One benefit of variable-length encoding is enabling more common source symbols (i.e. low entropy source symbols) to be represented by fewer bits, while less common source symbols (i.e. high entropy source symbols) are represented by comparatively more bits, thereby reducing the average number of bits needed to encode a set of symbols.

As used herein "input stream" refers to a source of input data that may be provided to an encoding engine for encoding. The term input stream represents the various facilities that may provide the data to an encoding engine, such as, file streams, file handles, network sockets, Unix domain sockets, Windows sockets, pipes, named pipes, message queues, shared buffers, file mappings, databases, distributed data stores, or the like, or combination thereof. For example, an input stream may present data from a very large file or a document file that is provided to an encoding engine using operating system file input/output facilities. Or, the input stream could present data provided by a network socket connected to a remote data source. Herein, for brevity and clarity all sources of data provided to the encoding engine are referred to as input streams.

As used herein "encoded stream" refers to data that is both encoded and provided by an encoding engine. Similar to input streams above, encoded streams represent various facilities that provide encoded data, such as file streams, file handles, network sockets, Unix domain sockets, Windows sockets, pipes, named pipes, message queues, shared buffers, file mappings, databases, distributed data stores, or the like, or combination thereof. The encoding engine may produce the encoded stream and/or save the encoded data. Herein, for brevity and clarity, encoded data produced by an encoding engine is referred to as an encoded stream.

As used herein "output stream" refers to un-encoded data that may be provided by a decoding engine. Herein, for brevity and clarity all un-encoded data provided by a decoding engine are referred to as output streams. See, input stream above.

The following briefly describes the various embodiments to provide a basic understanding of some aspects of the invention. This brief description is not intended as an extensive overview. It is not intended to identify key or critical elements, or to delineate or otherwise narrow the scope. Its purpose is merely to present some concepts in a simplified form as a prelude to the more detailed description that is presented later.

Briefly stated, various embodiments are directed to encoding data over a network. In one or more of the various embodiments, one or more encoding engines may be instantiated to perform various actions, described below.

In one or more of the various embodiments, the one or more encoding engines may select one of a plurality of source symbols based on an input stream of data such that each source symbol includes a numerical value.

In one or more of the various embodiments, the one or more encoding engines may generate an offset constant for the source symbol based on a numerical value of a provided start code. In one or more of the various embodiments, the start code may define a number of data bits in the code word before a first control bit is inserted such that the step code defines a number of data bits found before each subsequent control bit is inserted. Also, in one or more of the various embodiments, generating the offset constant may include determining a pattern of the iteration based on the offset constant such that the pattern repeats with a same number of bits as the step code.

In one or more of the various embodiments, the one or more encoding engines may be arranged to convert the source symbol to a raw code based on the offset constant and the source symbol's numerical value. In one or more of the various embodiments, converting the source symbol to the raw code may include subtracting the offset constant from the source symbol's numerical value.

In one or more of the various embodiments, the one or more encoding engines may be arranged to generate a code word by performing actions, including: (1) identifying a position in the raw code based on a numerical value of the start code; (2) inserting at the position a control bit; and (3) iteratively identifying one or more next positions in the raw code based on a numerical value of the step code until an end of the raw code is reached, such that additional control bits may be inserted at the one or more next positions, and such that a last control bit may be appended to an end of the code word.

In one or more of the various embodiments, the one or more encoding engines may be arranged to provide the code word to an output stream. In one or more of the various embodiments, the code word may represent a copy match offset token generated by a text compression algorithm. Also, in one or more of the various embodiments, the code word may encode a variable length for header field content.

In one or more of the various embodiments, the one or more encoding engines may be arranged to employ a zero value of the control bit to indicate there is at least one more control bit in the code word; and employ a 1 value of the control bit to indicate the end of the code word.

In one or more of the various embodiments, the one or more encoding engines may be arranged to monitor operation of the network; if the operation of the network is less than a threshold, one or more of the start code or the step code may be modified; and if the operation of the network is more than the threshold, the modified one or more of the start code or the step code may be restored to their original or previous values.

Illustrated Operating Environment

FIG. 1 shows components of one embodiment of an environment in which embodiments of the invention may be practiced. Not all the components may be required to practice the invention, and variations in the arrangement and type of the components may be made without departing from the spirit or scope of the invention. As shown, system 100 of FIG. 1 includes local area networks (LANs)/wide area networks (WANs)–(network) 110, wireless network 108, client computers 102-105, and network computer 116.

In one embodiment, at least some of client computers 102-105 may operate over one or more wired and/or wireless networks, such as networks 108, and/or 110. Generally, client computers 102-105 may include virtually any computer capable of communicating over a network to send and receive information, perform various online activities, offline actions, or the like. In one embodiment, one or more of client computers 102-105 may be configured to operate within a business or other entity to perform a variety of services for the business or other entity. For example, client computers 102-105 may be configured to operate as a web server, firewall, client application, media player, mobile telephone, game console, desktop computer, or the like. However, client computers 102-105 are not constrained to these services and may also be employed, for example, as for end-user computing in other embodiments. It should be recognized that more or less client computers (as shown in FIG. 1) may be included within a system such as described herein, and embodiments are therefore not constrained by the number or type of client computers employed.

Computers that may operate as client computer 102 may include computers that typically connect using a wired or wireless communications medium such as personal computers, multiprocessor systems, microprocessor-based or programmable electronic devices, network PCs, or the like. In some embodiments, client computers 102-105 may include virtually any portable computer capable of connecting to another computer and receiving information such as, laptop computer 103, mobile computer 104, tablet computers 105, or the like. However, portable computers are not so limited and may also include other portable computers such as cellular telephones, display pagers, radio frequency (RF) devices, infrared (IR) devices, Personal Digital Assistants (PDAs), handheld computers, wearable computers, integrated devices combining one or more of the preceding computers, or the like. As such, client computers 102-105 typically range widely in terms of capabilities and features. Moreover, client computers 102-105 may access various computing applications, including a browser, or other web-based application.

A web-enabled client computer may include a browser application that is configured to receive and to send web pages, web-based messages, and the like. The browser application may be configured to receive and display graphics, text, multimedia, and the like, employing virtually any web-based language, including a wireless application protocol messages (WAP), and the like. In one embodiment, the browser application is enabled to employ Handheld Device Markup Language (HDML), Wireless Markup Language (WML), WMLScript, JavaScript, Standard Generalized Markup Language (SGML), HyperText Markup Language (HTML), eXtensible Markup Language (XML), JavaScript Object Notation (JSON), or the like, to display and send a message. In one embodiment, a user of the client computer may employ the browser application to perform various activities over a network (online). However, another application may also be used to perform various online activities.

Client computers 102-105 also may include at least one other client application that is configured to receive and/or send content between another computer. The client application may include a capability to send and/or receive content, or the like. The client application may further provide information that identifies itself, including a type, capability, name, and the like. In one embodiment, client computers 102-105 may uniquely identify themselves through any of a variety of mechanisms, including an Internet Protocol (IP) address, a phone number, Mobile Identification Number (MIN), an electronic serial number (ESN), universally unique identifiers (UUIDs), or other device identifiers. Such information may be provided in a network packet, or the like, sent between other client computers, job tracking computer 116, or other computers.

Wireless network 108 is configured to couple client computers 103-105 and its components with network 110. Wireless network 108 may include any of a variety of wireless sub-networks that may further overlay stand-alone ad-hoc networks, and the like, to provide an infrastructure-oriented connection for client computers 103-105. Such sub-networks may include mesh networks, Wireless LAN (WLAN) networks, cellular networks, and the like. In one embodiment, the system may include more than one wireless network.

Wireless network 108 may further include an autonomous system of terminals, gateways, routers, and the like connected by wireless radio links, and the like. These connectors may be configured to move freely and randomly and organize themselves arbitrarily, such that the topology of wireless network 108 may change rapidly.

Wireless network 108 may further employ a plurality of access technologies including 2nd (2G), 3rd (3G), 4th (4G) 5th (5G) generation radio access for cellular systems, WLAN, Wireless Router (WR) mesh, and the like. Access technologies such as 2G, 3G, 4G, 5G, and future access networks may enable wide area coverage for mobile computers, such as client computers 103-105 with various degrees of mobility. In one non-limiting example, wireless network 108 may enable a radio connection through a radio network access such as Global System for Mobil communication (GSM), General Packet Radio Services (GPRS), Enhanced Data GSM Environment (EDGE), code division multiple access (CDMA), time division multiple access (TDMA), Wideband Code Division Multiple Access (WCDMA), High Speed Downlink Packet Access (HSDPA), Long Term Evolution (LTE), and the like. In essence, wireless network 108 may include virtually any wireless communication mechanism by which information may travel between client computers 103-105 and another computer, network, a cloud-based network, a cloud instance, or the like.

Network 110 is configured to couple network computers with other computers, including network computer 116 and client computers 102-105 through wireless network 108, or the like. Network 110 is enabled to employ any form of computer readable media for communicating information from one electronic device to another. Also, network 110 can include the Internet in addition to local area networks (LANs), wide area networks (WANs), direct connections, such as through a universal serial bus (USB) port, other forms of computer-readable media, or any combination thereof. On an interconnected set of LANs, including those based on differing architectures and protocols, a router acts as a link between LANs, enabling messages to be sent from one to another. In addition, communication links within LANs typically include twisted wire pair or coaxial cable, while communication links between networks may utilize analog telephone lines, full or fractional dedicated digital lines including T1, T2, T3, and T4, and/or other carrier mechanisms including, for example, E-carriers, Integrated Services Digital Networks (ISDNs), Digital Subscriber Lines (DSLs), wireless links including satellite links, or other communications links known to those skilled in the art. Moreover, communication links may further employ any of a variety of digital signaling technologies, including without limit, for example, DS-0, DS-1, DS-2, DS-3, DS-4, OC-3, OC-12, OC-48, or the like. Furthermore, remote computers and other related electronic devices could be remotely connected to either LANs or WANs via a modem and temporary telephone link. In one embodiment, network 110 may be configured to transport information of an Internet Protocol (IP).

Additionally, communication media typically embodies computer readable instructions, data structures, program modules, or other transport mechanism and includes any information non-transitory delivery media or transitory delivery media. By way of example, communication media includes wired media such as twisted pair, coaxial cable, fiber optics, wave guides, and other wired media and wireless media such as acoustic, RF, infrared, and other wireless media.

One embodiment of client computers 102-105 are described in more detail below in conjunction with client computer 200 of FIG. 2. However, the functionality described in conjunction with network computer 300 of FIG. 3 may also be performed by client computers 102-105, and it is only for reasons of brevity that client computers 102-105 are associated with client computer 200 of FIG. 2. Briefly, client computers 102-105 decode encoded source symbols. Client computers 102-105 may perform these operations in isolation, or in the context of another computing process. For example, decoding source symbols may be performed in the context of processing a header (e.g. a packet header), decompressing a text file such as a Lempel-Ziv (LZ) compressed text file, or the like.

One embodiment of network computer 116 is described in more detail below in conjunction with network computer 300 of FIG. 3. However, the functionality described in conjunction with client computer 200 of FIG. 2 may also be performed by network computer 116, and it is only for reasons of brevity that network computer 116 is associated with network computer 300 of FIG. 3. Briefly, however, network computer 116 encodes source symbols using an interleaved start-step encoding algorithm. Source symbols may be encoded in isolation, or in the context of a computing process such as LZ encoding, generating a packet header, or the like.

Although FIG. 1 illustrates network computer 116 as a single computer, the innovations and/or embodiments are not so limited. For example, one or more functions of network computer 116 may be distributed across one or more distinct network computers. Moreover, network computer 116 is not limited to a particular configuration such as the one shown in FIG. 1. Thus, in one embodiment, network computer 116 may be implemented using a plurality of network computers. In other embodiments, network computer 116 may be implemented using a plurality of network computers in a cluster architecture, a peer-to-peer architecture, or the like. Further, in at least one of the various embodiments, network computer 116 may be implemented using one or more cloud instances in one or more cloud networks. Accordingly, these innovations and embodiments are not to be construed as being limited to a single environment, and other configurations, and architectures are also envisaged.

Illustrative Client Computer

Figure 2:
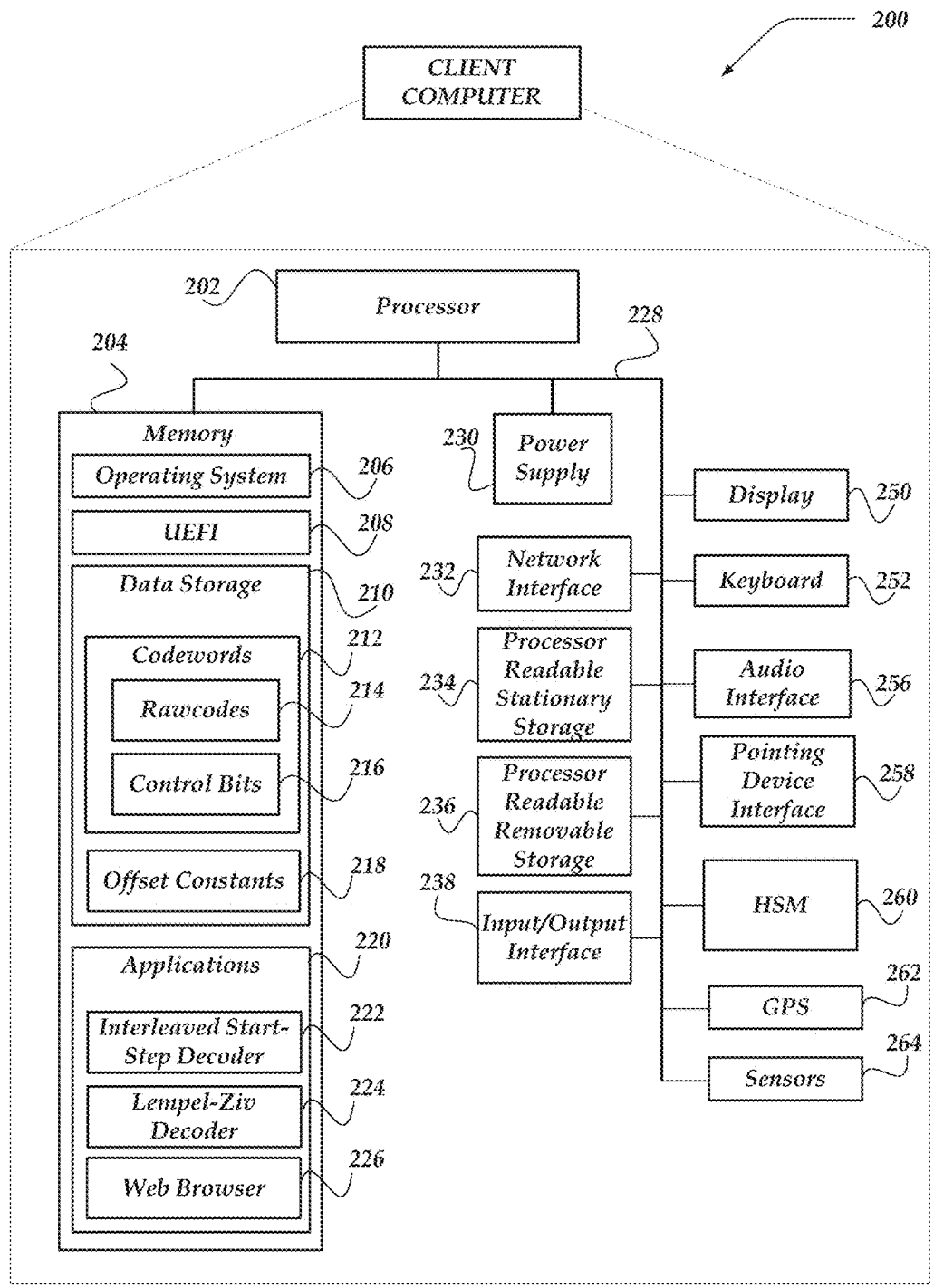
FIG. 2 shows an embodiment of a client computer that may be included in a system such as that shown in FIG. 1.

FIG. 2 shows one embodiment of client computer 200 that may include many more or less components than those shown. Client computer 200 may represent, for example, at least one embodiment of mobile computers or client computers shown in FIG. 1.

As shown in the figure, client computer 200 includes a processor 202 in communication with a memory 204 via a bus 228. Client computer 200 also includes a power supply 230, network interface 232, audio interface 256, global positioning systems (GPS) receiver 262, display 250, keyboard 252, input/output interface 238, processor-readable stationary storage device 234, and processor-readable removable storage device 236. Power supply 230 provides power to mapper computer 200. In some embodiments, processor 202 may be a multiprocessor system that includes one or more processors each having one or more processing/execution cores.

Network interface 232 includes circuitry for coupling computer 200 to one or more networks, and is constructed for use with one or more communication protocols and technologies including, but not limited to, protocols and technologies that implement any portion of the Open Systems Interconnection model (OSI model), global system for mobile communication (GSM), code division multiple access (CDMA), time division multiple access (TDMA), user datagram protocol (UDP), transmission control protocol/Internet protocol (TCP/IP), Short Message Service (SMS), Multimedia Messaging Service (MMS), general packet radio service (GPRS), WAP, ultra wide band (UWB), IEEE 802.16 Worldwide Interoperability for Microwave Access (WiMax), Session Initiation Protocol/Real-time Transport Protocol (SIP/RTP), or of a variety of other wired and wireless communication protocols. Network interface 232 is sometimes known as a transceiver, transceiving device, or network interface card (NIC). Client computer 200 may optionally communicate with a base station (not shown), or directly with another computer.

Audio interface 256 is arranged to produce and receive audio signals such as the sound of a human voice. For example, audio interface 256 may be coupled to a speaker and microphone (not shown) to enable telecommunication with others and/or generate an audio acknowledgement for some action. A microphone in audio interface 256 can also be used for input to or control of client computer 200, for example, using voice recognition.

Display 250 may be a liquid crystal display (LCD), gas plasma, electronic ink, light emitting diode (LED), Organic LED (OLED) or any other type of light reflective or light transmissive display that can be used with a computer. Display 250 may be a handheld projector or pico projector capable of projecting an image on a wall or other object.

Figure 3:
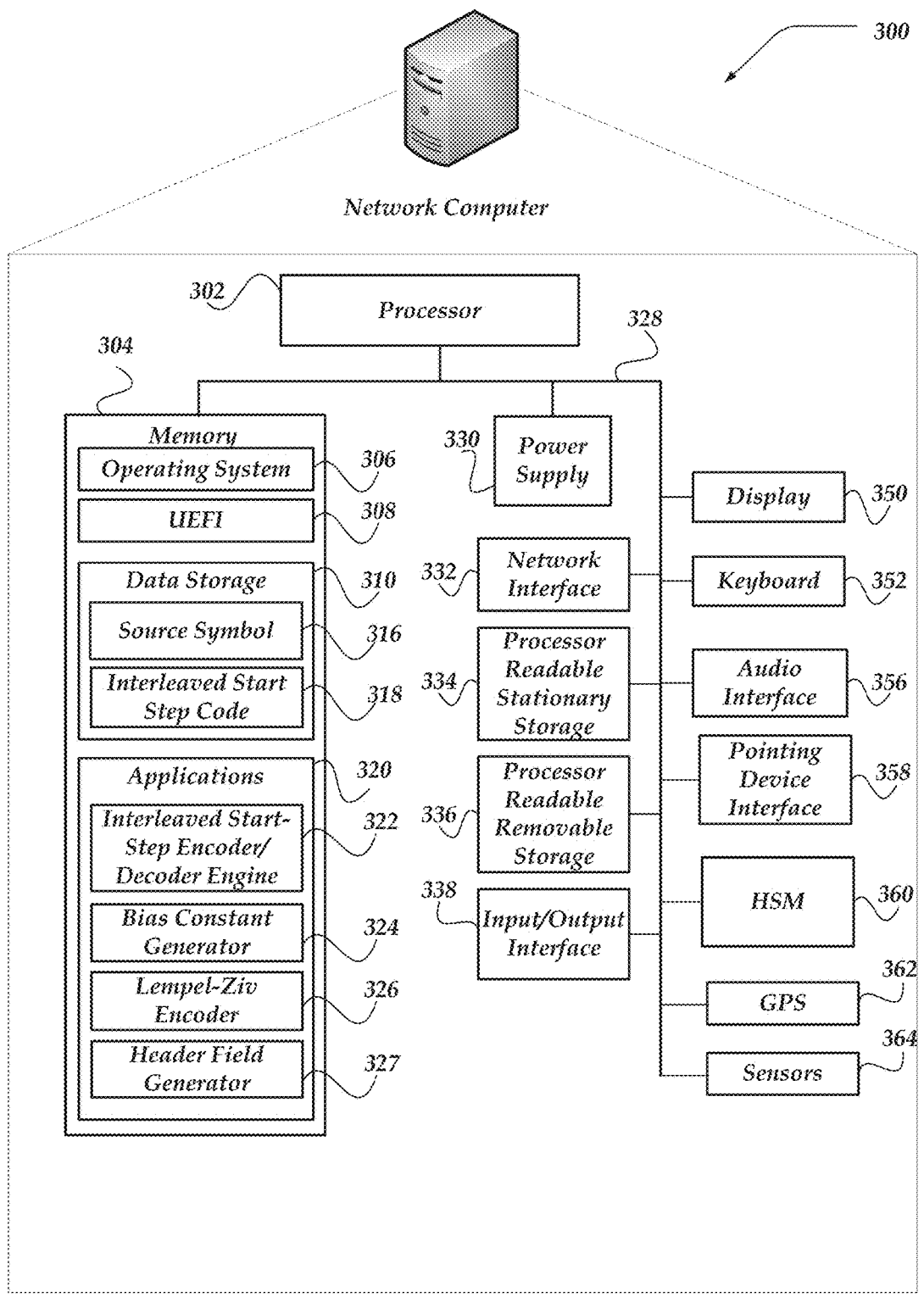
FIG. 3 shows an embodiment of a network computer that may be included in a system such as that shown in FIG. 1.

Client computer 200 may also comprise input/output interface 238 for communicating with external devices or computers not shown in FIG. 3. Input/output interface 238 can utilize one or more wired or wireless communication technologies, such as USB™, Firewire™, WiFi, WiMax, Thunderbolt™, Infrared, Bluetooth™, Zigbee™, serial port, parallel port, and the like.

GPS transceiver 262 can determine the physical coordinates of client computer 200 on the surface of the Earth, which typically outputs a location as latitude and longitude values. GPS transceiver 262 can also employ other geo-positioning mechanisms, including, but not limited to, tri-angulation, assisted GPS (AGPS), Enhanced Observed Time Difference (E-OTD), Cell Identifier (CI), Service Area Identifier (SAI), Enhanced Timing Advance (ETA), Base Station Subsystem (BSS), or the like, to further determine the physical location of client computer 200 on the surface of the Earth. It is understood that under different conditions, GPS transceiver 262 can determine a physical location for client computer 200.

Client computer 200 may also include sensors 264 for determining geolocation information (e.g., GPS), monitoring electrical power conditions (e.g., voltage sensors, current sensors, frequency sensors, and so on), monitoring weather (e.g., thermostats, barometers, anemometers, humidity detectors, precipitation scales, or the like), light monitoring, audio monitoring, motion sensors, or the like. Sensors 264 may be one or more hardware sensors that collect and/or measure data that is external to client computer 200

In at least one embodiment, however, client computer 200 may, through other components, provide other information that may be employed to determine a physical location of the client computer, including for example, a Media Access Control (MAC) address, IP address, and the like.

Human interface components can be physically separate from client computer 200, allowing for remote input and/or output to client computer 200. For example, information routed as described here through human interface components such as display 250 or keyboard 252 can instead be routed through the network interface 232 to appropriate human interface components located elsewhere on the network. Human interface components include any component that allows the computer to take input from, or send output to, a human user of a computer. Accordingly, pointing devices such as mice, styluses, track balls, or the like, may communicate through pointing device interface 258 to receive user input.

Memory 204 may include Random Access Memory (RAM), Read-Only Memory (ROM), and/or other types of non-transitory computer readable and/or writeable media. Memory 204 illustrates an example of computer-readable storage media (devices) for storage of information such as computer-readable instructions, data structures, program modules or other data. Memory 204 stores a unified extensible firmware interface (UEFI) 208 for controlling low-level operation of client computer 200. The memory also stores an operating system 206 for controlling the operation of client computer 200. It will be appreciated that this component may include a general-purpose operating system such as a version of UNIX, or LINUX™, or a specialized operating system such as Microsoft Corporation's Windows® operating system, or the Apple Corporation's OSX® operating system. The operating system may include, or interface with a Java virtual machine module that enables control of hardware components and/or operating system operations via Java application programs. Likewise, other runtime environments may be included.

Memory 204 may further include one or more data storage 210, which can be utilized by client computer 200 to store, among other things, codewords 212, offset constants 218, and applications 220. In one embodiment, codewords 212 represent encoded symbols, and include rawcodes 214 and control bits 216. In one embodiment, at least some of data storage 210 might also be stored on another component of client computer 200, including, but not limited to, non-transitory media inside processor-readable removable storage device 236, processor-readable stationary storage device 234, or any other computer-readable storage device within client computer 200, or even external to client computer 200.

Applications 220 may include computer executable instructions which, when executed by client computer 200, transmit, receive, and/or otherwise process messages (e.g., SMS, Multimedia Messaging Service (MMS), Instant Message (IM), email, and/or other messages), audio, video, and enable telecommunication with another user of another mobile computer. Other examples of application programs include calendars, search programs, email client applications, IM applications, SMS applications, Voice Over Internet Protocol (VOIP) applications, contact managers, task managers, transcoders, database programs, word processing programs, security applications, spreadsheet programs, games, search programs, and so forth. Applications 220 also includes interleaved start-step decoder 222 discussed below in conjunction with FIG. 10 and Lempel-Ziv decoder 224 discussed below in conjunction with FIG. 8. Applications 220 also includes Web Browser 226, or the like, that may perform actions further described below in conjunction with FIG. 9. In at least one of the various embodiments, one or more of the applications may be implemented as modules and/or components of another application. Further, in at least one of the various embodiments, applications may be implemented as operating system extensions, modules, plugins, or the like.

In at least one of the various embodiments, applications, such as, web browser 226, or the like, may be arranged to employ geo-location information to select one or more localization features, such as, time zones, languages, currencies, calendar formatting, or the like. Localization features may be used in user-interfaces, reports, as well as internal processes and/or databases. In at least one of the various embodiments, geo-location information used for selecting localization information may be provided by GPS 262. Also, in some embodiments, geolocation information may include information provided using one or more geo-location protocols over the networks, such as, wireless network 108 and/or network 110.

Furthermore, in at least one of the various embodiments, applications 220, or the like, may be operative in a cloud-based computing environment. In at least one of the various embodiments, in this context applications may flow from one physical network computer within the cloud-based environment to another depending on performance and scaling considerations automatically managed by the cloud computing environment. Likewise, in at least one of the various embodiments, virtual machines and/or virtual servers may be provisioned and de-commissioned automatically.

Further, in some embodiments, client computer 200 may also include hardware security module (HSM) 260 for providing additional tamper resistant safeguards for generating, storing and/or using security/cryptographic information such as, keys, digital certificates, passwords, passphrases, two-factor authentication information, or the like. In some embodiments, hardware security module may be employed to support one or more standard public key infrastructures (PKI), and may be employed to generate, manage, and/or store keys pairs, or the like. In some embodiments, HSM 260 may be arranged as a hardware card that may be installed in a network computer.

Additionally, in one or more embodiments (not shown in the figures), client computer 200 may include one or more embedded logic hardware devices instead of one or more CPUs, such as, Application Specific Integrated Circuits (ASICs), Field Programmable Gate Arrays (FPGAs), Programmable Array Logic (PALs), or the like, or combination thereof. The one or more embedded logic hardware devices may directly execute its embedded logic to perform actions. Also, in one or more embodiments (not shown in the figures), the network computer may include one or more hardware microcontrollers instead of one or more CPUs. In at least one embodiment, the one or more microcontrollers may directly execute embedded logic to perform actions and access their own internal memory and their own external Input and Output Interfaces (e.g., hardware pins and/or wireless transceivers) to perform actions. E.g., they may be arranged as Systems On Chips (SOCs).

Illustrative Network Computer

FIG. 3 shows one embodiment of network computer 300 that may be included in a system implementing one or more embodiments of the described innovations. Network computer 300 may include many more or less components than those shown in FIG. 3. However, the components shown are sufficient to disclose an illustrative embodiment for practicing these innovations. Network computer 300 may represent, for example, one embodiment of network computer 116 of FIG. 1.

As shown in the figure, network computer 300 includes a processor 302 in communication with a memory 304 via a bus 328. Network computer 300 also includes a power supply 330, network interface 332, audio interface 356, global positioning systems (GPS) receiver 362, display 350, keyboard 352, input/output interface 338, processor-readable stationary storage device 334, and processor-readable removable storage device 336. Power supply 330 provides power to network computer 300. In some embodiments, processor 302 may be a multiprocessor system that includes one or more processors each having one or more processing/execution cores.

Network interface 332 includes circuitry for coupling network computer 300 to one or more networks, and is constructed for use with one or more communication protocols and technologies including, but not limited to, protocols and technologies that implement any portion of the Open Systems Interconnection model (OSI model), global system for mobile communication (GSM), code division multiple access (CDMA), time division multiple access (TDMA), user datagram protocol (UDP), transmission control protocol/Internet protocol (TCP/IP), Short Message Service (SMS), Multimedia Messaging Service (MMS), general packet radio service (GPRS), WAP, ultra wide band (UWB), IEEE 802.16 Worldwide Interoperability for Microwave Access (WiMax), Session Initiation Protocol/Real-time Transport Protocol (SIP/RTP), or any of a variety of other wired and wireless communication protocols. Network interface 332 is sometimes known as a transceiver, transceiving device, or network interface card (NIC). Network computer 300 may optionally communicate with a base station (not shown), or directly with another computer.

Audio interface 356 is arranged to produce and receive audio signals such as the sound of a human voice. For example, audio interface 356 may be coupled to a speaker and microphone (not shown) to enable telecommunication with others and/or generate an audio acknowledgement for some action. A microphone in audio interface 356 can also be used for input to or control of network computer 300, for example, using voice recognition.

Display 350 may be a liquid crystal display (LCD), gas plasma, electronic ink, light emitting diode (LED), Organic LED (OLED) or any other type of light reflective or light transmissive display that can be used with a computer. Display 350 may be a handheld projector or pico projector capable of projecting an image on a wall or other object.

Network computer 300 may also comprise input/output interface 338 for communicating with external devices or computers not shown in FIG. 3. Input/output interface 338 can utilize one or more wired or wireless communication technologies, such as USB™, Firewire™, WiFi, WiMax, Thunderbolt™, Infrared, Bluetooth™, Zigbee™, serial port, parallel port, and the like.

GPS transceiver 362 can determine the physical coordinates of network computer 300 on the surface of the Earth, which typically outputs a location as latitude and longitude values. GPS transceiver 362 can also employ other geo-positioning mechanisms, including, but not limited to, triangulation, assisted GPS (AGPS), Enhanced Observed Time Difference (E-OTD), Cell Identifier (CI), Service Area Identifier (SAI), Enhanced Timing Advance (ETA), Base Station Subsystem (BSS), or the like, to further determine the physical location of network computer 300 on the surface of the Earth. It is understood that under different conditions, GPS transceiver 362 can determine a physical location for network computer 300.

Network computer 300 may also include sensors 364 for determining geolocation information (e.g., GPS), monitoring electrical power conditions (e.g., voltage sensors, current sensors, frequency sensors, and so on), monitoring weather (e.g., thermostats, barometers, anemometers, humidity detectors, precipitation scales, or the like), light monitoring, audio monitoring, motion sensors, or the like. Sensors 364 may be one or more hardware sensors that collect and/or measure data that is external to network computer 300.

In at least one embodiment, however, network computer 300 may, through other components, provide other information that may be employed to determine a physical location of the client computer, including for example, a Media Access Control (MAC) address, IP address, and the like.

In at least one of the various embodiments, applications, such as, operating system 306, interleaved start-stop encoder engine 322 (encoding engines), bias constant generator 324, LZ encoder 326, header field generator 327, or the like, may be arranged to employ geo-location information to select one or more localization features, such as, time zones, languages, currencies, calendar formatting, radio transmission parameters, start codes, step codes, or the like. Localization features may be used when interpreting network traffic, monitoring network performance, user-interfaces, reports, as well as internal processes and/or databases. In at least one of the various embodiments, geo-location information used for selecting localization information may be provided by GPS 362. Also, in some embodiments, geolocation information may include information provided using one or more geolocation protocols over the networks, such as, wireless network 108 and/or network 110.

Human interface components can be physically separate from network computer 300, allowing for remote input and/or output to network computer 300. For example, information routed as described here through human interface components such as display 350 or keyboard 352 can instead be routed through the network interface 332 to appropriate human interface components located elsewhere on the network. Human interface components include any component that allows the computer to take input from, or send output to, a human user of a computer. Accordingly, pointing devices such as mice, styluses, track balls, or the like, may communicate through pointing device interface 358 to receive user input.

Memory 304 may include Random Access Memory (RAM), Read-Only Memory (ROM), and/or other types of non-transitory computer readable and/or writeable media. Memory 304 illustrates an example of computer-readable storage media (devices) for storage of information such as computer-readable instructions, data structures, program modules or other data. Memory 304 stores a unified extensible firmware interface (UEFI) 308 for controlling low-level operation of network computer 300. The memory also stores an operating system 306 for controlling the operation of network computer 300. It will be appreciated that this component may include a general-purpose operating system such as a version of UNIX, or LINUX™, or a specialized operating system such as Microsoft Corporation's Windows® operating system, or the Apple Corporation's OSX® operating system. The operating system may include, or interface with a Java virtual machine module that enables control of hardware components and/or operating system operations via Java application programs. Likewise, other runtime environments may be included.

Memory 304 may further include one or more data storage 310, which can be utilized by network computer 300 to store, among other things, applications 320 and/or other data. Data storage 310 may also be employed to store source symbol 316 and interleaved start step code 318. Data storage 310 may further include program code, data, algorithms, and the like, for use by one or more processors, such as processor 302 to execute and perform actions such as those actions described below. In one embodiment, at least some of data storage 310 might also be stored on another component of network computer 300, including, but not limited to, non-transitory media inside processor-readable removable storage device 336, processor-readable stationary storage device 334, or any other computer-readable storage device within network computer 300, or even external to network computer 300.

In one or more of the various embodiments, source symbol 316 may include a fixed length integer, an integer of arbitrary length, a character, or any other kind of binary data.

Source symbol 316 may, in one embodiment, be encoded by interleaved start-step encoder engine 322.

In one or more of the various embodiments, interleaved start step code 318, as discussed below in conjunction with FIG. 7, includes start number and a step number. The start number represents a number of data bits occurring in the encoded output before a first control bit, while the step number represents a number of bits occurring before subsequent control bits.

Applications 320 may include computer executable instructions which, when executed by network computer 300, transmit, receive, and/or otherwise process messages (e.g., SMS, Multimedia Messaging Service (MIMS), Instant Message (IM), email, and/or other messages), audio, video, and enable telecommunication with another user of another mobile computer. Other examples of application programs include calendars, search programs, email client applications, IM applications, SMS applications, Voice Over Internet Protocol (VOIP) applications, contact managers, task managers, transcoders, database programs, word processing programs, security applications, spreadsheet programs, games, search programs, and so forth. Applications 320 may also include interleaved start-step encoder engine 322, bias constant generator 324, Lempel-Ziv encoder 326, header field generator 327, or the like, that may perform actions further described below. In at least one of the various embodiments, one or more of the applications may be implemented as modules and/or components of another application. Further, in at least one of the various embodiments, applications may be implemented as operating system extensions, modules, plugins, or the like.

In one or more of the various embodiments, interleaved start-step encoder engine 322, discussed below in conjunction with FIG. 10, encodes a source symbol 316 based on an interleaved start-step code 318. In one or more of the various embodiments, interleaved start-step encoder engine 322 invokes bias constant generator 324 to create offset constants used to convert source symbol 316 into a rawcode, and then interleaves control bits to produce an encoded output.

In one or more of the various embodiments, Lempel-Ziv encoder 326 and header field generator 327 are example contexts in which interleaved start-step encoder engine 322 can be utilized. In one or more of the various embodiments, discussed below in conjunction with FIG. 8, Lempel-Ziv encoder 326 utilizes interleaved start-step encoder engine 322 to encode "copy match offset/length" tokens and/or "copy literal length" tokens.

In one or more of the various embodiments, header field generator 327, discussed below in conjunction with FIG. 9, utilizes interleaved start-step encoder engine 322 to encode data typically found in a header, such as a TCP/IP header. Header field generator 327 may, in one embodiment, use a sequence of bits indicating which fields of a set of possible fields are included in a given header. Then, each included field is encoded, sequentially in memory without byte-aligned padding, using interleaved start-step encoder engine 322.

In at least one of the various embodiments, interleaved start-step encoder engine 322, bias constant generator 324, Lempel-Ziv encoder 326, header field generator 327 or the like, may be operative in a cloud-based computing environment. In at least one of the various embodiments, these engines, and others, that comprise the modeling platform that may be executing within virtual machines and/or virtual servers that may be managed in a cloud-based based computing environment. In at least one of the various embodiments, in this context applications including the engines may flow from one physical network computer within the cloud-based environment to another depending on performance and scaling considerations automatically managed by the cloud computing environment. Likewise, in at least one of the various embodiments, virtual machines and/or virtual servers dedicated to interleaved start-step encoder engine 322, bias constant generator 324, Lempel-Ziv encoder 326, header field generator 327, or the like, may be provisioned and de-commissioned automatically.

Further, in some embodiments, network computer 300 may also include hardware security module (HSM) 360 for providing additional tamper resistant safeguards for generating, storing and/or using security/cryptographic information such as, keys, digital certificates, passwords, passphrases, two-factor authentication information, or the like. In some embodiments, hardware security module may be employed to support one or more standard public key infrastructures (PKI), and may be employed to generate, manage, and/or store keys pairs, or the like. In some embodiments, HSM 360 may be arranged as a hardware card that may be installed in a network computer.

Additionally, in one or more embodiments (not shown in the figures), network computer 300 may include one or more embedded logic hardware devices instead of one or more CPUs, such as, Application Specific Integrated Circuits (ASICs), Field Programmable Gate Arrays (FPGAs), Programmable Array Logic (PALs), or the like, or combination thereof. The one or more embedded logic hardware devices may directly execute its embedded logic to perform actions. Also, in one or more embodiments (not shown in the figures), the network computer may include one or more hardware microcontrollers instead of one or more CPUs. In at least one embodiment, the one or more microcontrollers may directly execute embedded logic to perform actions and access their own internal memory and their own external Input and Output Interfaces (e.g., hardware pins and/or wireless transceivers) to perform actions. E.g., they may be arranged as Systems On Chips (SOCs).

Illustrative Logical System Architecture

Figure 4:
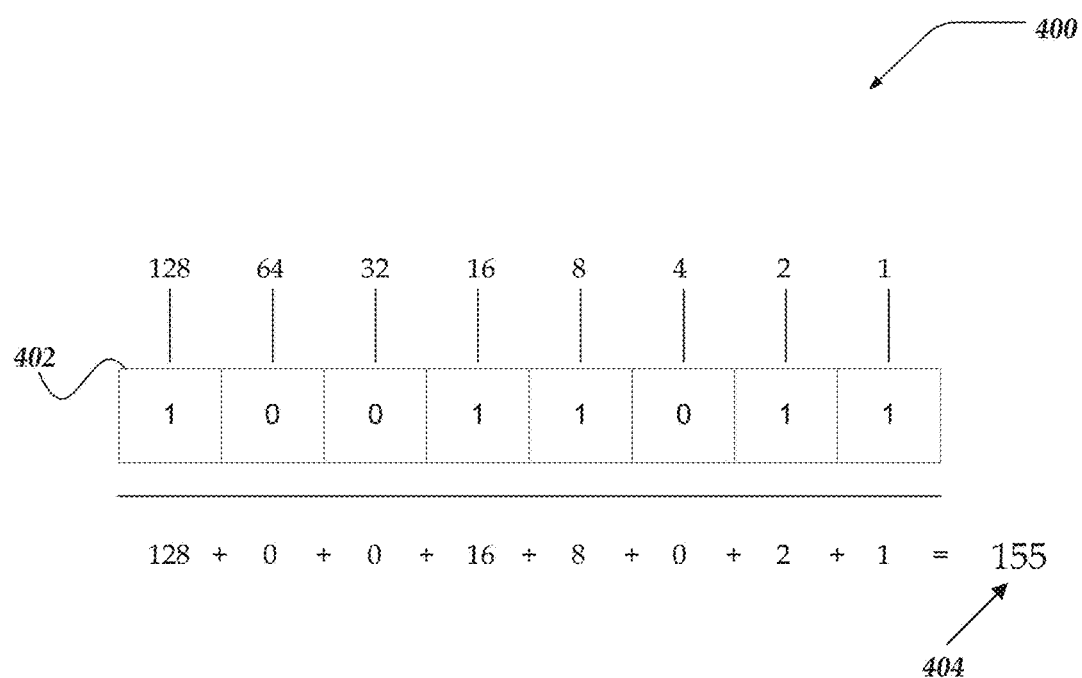
FIG. 4 illustrates a fixed length representation of an integer.

FIG. 4 illustrates a fixed length representation 400 of an integer using binary numeral system. The ability to store and manipulate numerical quantities is present in virtually any computer system, large or small. Number systems allow quantities to be represented using place-value notation. Each digit has an associated weight or place-value equal to the digit times the base raised to its positional power; e.g. for the number 155, the number 1 weighs $1 \times 10^2 = 100$, the leftmost 5 weighs $5 \times 10^1 = 50$, and the rightmost 5 weighs $5 \times 10^0 = 5$. The sum of the weighted values equals the magnitude of the number: 100+50+5=155.

Therefore, the same number 155 in base-10 is equivalent to 10011011 in base-2. However, in order to represent a number such as 10011011 in computer memory, it must be known where in memory the number begins and where it ends. Using a fixed-length representation, each binary quantity has an associated implicit length in bits. This is usually determined by the computer architecture. In 16-bit systems, the number 155 would be represented with 16 bits as 0000000010011011. In this embodiment, the number 10011011 is zero-padded with eight 0's. In 32-bit systems, the number 155 would be represented with 32 bits as 00000000000000000000000010011011. A fixed-length representation simplifies memory loads, stores, and numerical manipulations by the processor. However, the zero padding of the most significant bits increases the space required for storage and transmission.

The main shortcoming of fixed-length codes is that they are not correlated to the entropy or information content of the number they represent. For example, the number 0 has less entropy than the number 123. This is because the number 123 carries more information than the number 0—it has 1 hundred, 2 tens, and 3 units, while the number 0 has none. However, when both numbers are stored in fixed-width computer memory or a processor register, they both take the same amount of space (e.g. 32-bits on a 32-bit architecture or 64-bits on a 64-bit architecture). However, a number with a smaller entropy, like zero, according to information theory, requires less space than a number with higher entropy (i.e. because the number with higher entropy contains more digits to represent in memory). Another disadvantage of a fixed-length representation is that the number of symbols must be known in advance to allocate a fixed length capable of storing all of the symbols.

Figure 5:
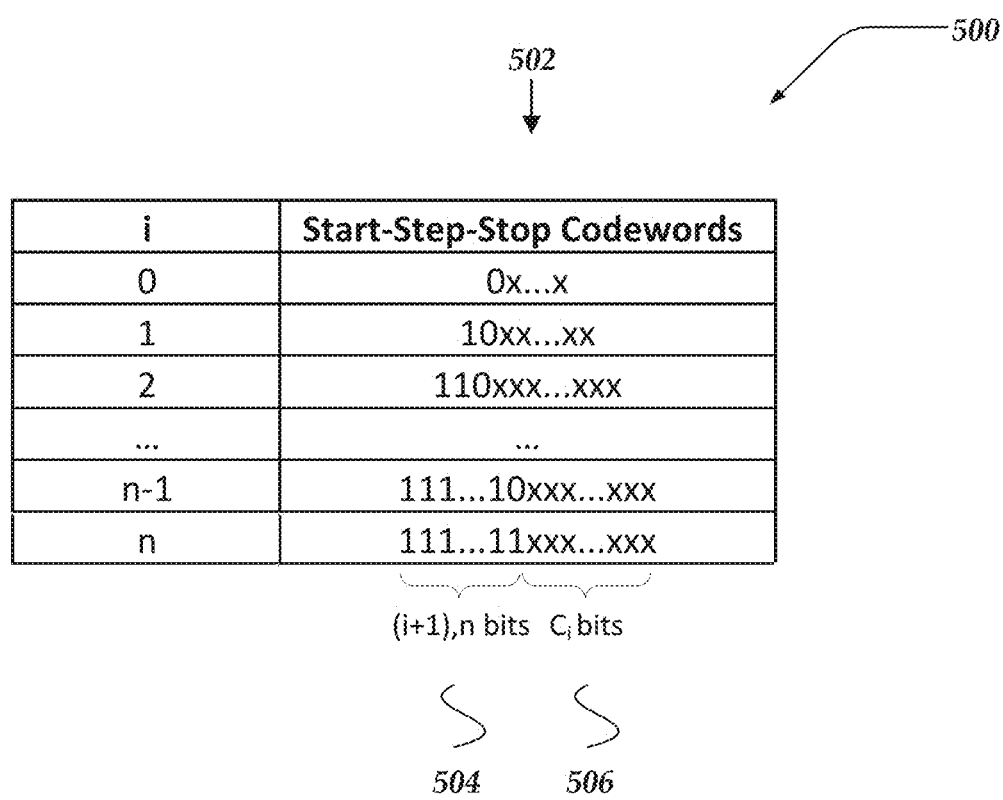
FIG. 5 illustrates a table of Start-Step-Stop codewords, including, for each step, the corresponding unary code and fixed length code.

FIG. 5 illustrates a table 500 of prior art start-step-stop (SSS) codeword shapes 502. A start-step-stop encoding is a prior-art variable length code. Variable-length codes provide an alternative to represent numbers that are better correlated to the entropy (i.e. information content) they carry. Specifically, a start-step-stop code enables lower entropy values, e.g. numbers with fewer digits, to be encoded with fewer bits, while larger entropy values, e.g. numbers with more digits, are encoded with more bits. Hence, variable-length codes are also more space efficient than their fixed-length counterparts.

As their name implies, variable-length codes may have different lengths to represent each symbol or number. One property every variable-length scheme should satisfy is the "prefix property". This property simply states that once a bit pattern or codeword is assigned to a symbol or number, no other codeword should start with the same bit pattern. In other words, they cannot share the same prefix. Otherwise, the decoder cannot distinguish whether the initial bit pattern and the bits that follow belong to the same symbol or correspond to two different symbols. Not meeting the prefix property would make any variable-length scheme undecodable, and hence, useless.

Start-step-stop codewords contain a unary portion 504 and a fixed length portion 506. The unary portion 504 encodes, based on the start-step-stop values, how many bits are contained in the fixed length portion 506 that follows. Specifically, the start value indicates the number of bits contained by the smallest codewords. The step value indicates increments in the number of bits as the sizes of codewords increase. The stop value indicates the largest number of bits in a codeword.

For example, with start-step-stop values of (0, 1, 5), codewords have 0, 1, 2, 3, 4, or 5 bits in their fixed length portion. If the unary portion contains "110", the unary encoding for 2, there are two bits that follow, for a total of $2^2=4$ possible codewords of that size. If the unary portion contains "11110", then 4 bits follow, for a total of $2^4=16$ possible codewords of that size. If the unary portion contains "0", the unary encoding for 0, there are no bits that follow. When the unary portion contains "0", there is only one rawcode, and it is encoded by the unary portion containing "0" without a fixed length portion. Finally, a special case optimization occurs when the unary portion encodes the largest value—in this case 5. Because the stop value is known to be 5, it is not necessary to encode 6 as a unary value. This allows the trailing "0" to be omitted, as no other unary codes will begin with "11111" (e.g. no "111110"), and so there is no need to disambiguate. As such, a unary value of "11111" indicates that 5 bits follow, for a total of $2^5=32$ possible codewords of that size.

In general, the number of bits $c_i$ in each subset i, where i=0, 1, 2, . . . , n, is determined by three integer parameters, start, step, and stop, where:

$$c_i=\text{start}+i*\text{step where }i=0,1,\ldots,n=(\text{stop}-\text{start})/\text{step}$$

Hence, each subset contains $2^{ci}$ fixed-length codewords, generated one subset at a time for each value of $c_i$. The concatenation of the unary code with each subset of $2^{ci}$ codewords makes the full start-step-stop code. The last subset contains a string of all bits equal to 1 and its length n equals (stop−start)/step value. The length of the unary code is (i+1) bits, except the last subset which equals n bits.

Figure 6:
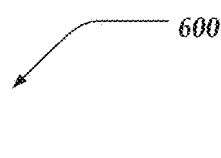
FIG. 6 illustrates a table of Start-Step-Stop codewords generated from a particular set of Start, Step, and Stop values, including a count and range of integers represented by each step.

FIG. 6 illustrates a table 600 of Start-Step-Stop codewords generated from a particular set of Start, Step, and Stop values, (3, 2, 9) including a count and range of integers represented by each step.

As indicated above n=(stop−start)/step. In this case, n=(stop−start)/step=(9−3)/2=6/2=3. As such, each subset is denoted in column 602 by a value of i=0, 1, 2, or 3.

Column 604 contains the number of bits contained in the trailing fixed-length portion, based on the formula $c_i$=start+i*step, i.e. 3, 5, 7, and 9.

Column 606 contains the shape of the resulting codewords, including their unary portion (0, 10, 110, 111) and their fixed-length portion (xxx, xxxxx, xxxxxxx, xxxxxxxxx).

Column 608 indicates how many symbols can be represented by each step (8, 32, 128, and 512), while Column 610 indicates the range of integer values stored in each step.

Figures 7A, 7B:
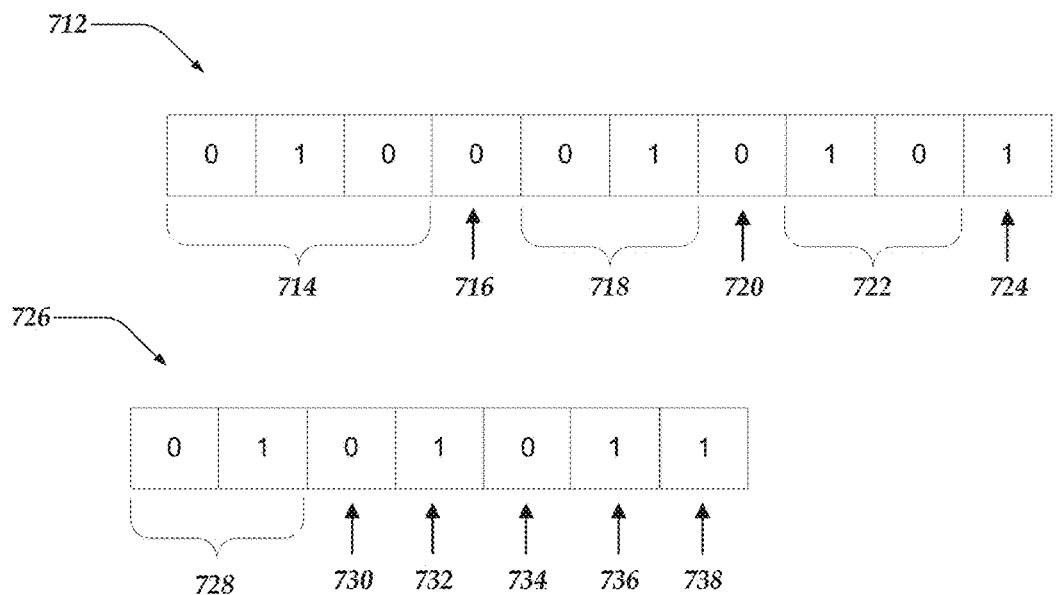
FIG. 7A illustrates a table of Interleaved Start-Step codewords generated from a particular set of Start and Step values, including a count and range of integers represented by each step.
FIG. 7B illustrates two examples of interleaved start-step codewords.

FIG. 7A illustrates a logical representation of data model 700 for implementing Interleaved Start-Step (ISS) codes generated from a particular set of Start and Step values, including a count and range of integers represented by each step. Interleaved start-step codes provide three novel improvements to the original start-step-stop coding scheme: (1) swap and interleave the unary code bits with the fixed-length code bits, which replaces the unary codes with control bits; (2) remove the last subset containing the "all ones" prefix code; and (3) replace the unary code for a one's complement of the unary code.

The rationale for (1) is twofold: simplified encoding/decoding and faster computation. By interleaving the bits, the encoder and decoder do not need to compute $c_i$, which determines the count for the number of codewords, from the unary code. When decoding, the computation of the integer value can be performed directly by calculating the value of the fixed-length code from the current subset, then computing a cumulative offset to be added later when detecting new subsets. The control bits determine whether a new subset follows: in one embodiment, if 0, there is a subsequent subset to decode; if 1, the last control bit is detected and decoding is complete. Also, the interleaved control bits clearly delimit the subset boundaries, making it clearer where they begin and end. None of this is possible using regular start-step-stop codes.

The rationale for (2) is also twofold: automatic range expansion and reduced code size. First, regular start-step-stop codes use all one bits (e.g., one valued bits, such as "1111") for the last subset, which is not a unary code. This reduces the length of the codewords from the last subset by one bit. However, it also makes it impossible to extend the range of integers or the maximum integer that can be represented. Another disadvantage is that both the encoder and decoder must know the number of stop bits because this determines the number of ones to detect for the last subset.

None of this is necessary for the interleaved start-step codes disclosed in the innovations included herein. The disclosed innovations inherently support automatic or dynamic range expansion by extending the number of 0 control bits. Therefore, in one or more of the various embodiments, integers of any size can be supported, up to the largest integer that the computer architecture can represent, or with the appropriate library for encoding large integers, an essentially arbitrarily large integer. Second, in the prior art start-step-stop code, detecting all one bits for the stop code adds another decision branch to the process which may require a larger or more complex implementation. This is not a problem for the disclosed interleaved start-step codes since stop parameters are unneeded.

The rationale for (3) is better optimization. By complementing the unary code bits, optimization may be improved if a second pass is performed since 0 bits (e.g., zero valued bits) tend to be more prevalent than 1 bits. Also, in some embodiments, it also produces better optimized assembly code by taking advantage of certain machine language instructions that add or subtract one using the carry flag.

Data model 700 depicts the above-discussed differences between interleaved start-step codes and the prior art start-step-stop codes. While columns 702, 704, 708, and 710 illustrate information similar to columns 602, 604, 608, and 610, respectively, of FIG. 6, column 706 depicts one difference between Interleave Start-Step codes and prior art start-step-stop codes depicted in column 606. Specifically, column 706 depicts data bits interleaved by control bits, obviating the need to generate a unary code before encoding data bits or parse a unary code before decoding data bits. Furthermore, data model 700, as indicted by ellipses in the bottom row, does not have a predefined end, as arbitrarily long integer values can be encoded by extending the number of "xx0" segments. Finally, instead of a unary code having a series of 1's followed by a 0 to indicate the end of the code, the control bits include a series of 0's followed by a 1 to indicate the end of the codeword.

For clarity, data model 700 is represented using a tabular format. In some of the various embodiments, data sets or data objects comprising data models, such as, data model 700 may be arranged differently, such as using different formats, data structures, objects, or the like.

FIG. 7B illustrates two examples of encoding integer source symbols using interleaved encoding. Codeword 712 illustrates the integer 78 (seventy-eight) encoded using a [3,2] start-step code. In this example, the start code is three and the step code is two. In this example, since codeword 712 is encoded using a [3, 2] code, the first 3 bits, bits 714 followed by control bit 716 indicate the start of the code word. In this example, since control bit 716 is a 0, and the [3, 2] code specifies a step code of 2-bits per step, bits 718 are data bits with control bit 720 following data bits 718. And, in this example, control bit 720 is 0-valued indicating that there is at least another step in codeword 712, the next two bits, are data bits 722 followed by control bit 724. However, since control bit 724 is 1-valued, it indicates that the end of the codeword has been reached.

In this example, because codeword 712 has a start code value of 3 it has three control bits (bit 716, bit 720, and bit 724), this corresponds to row 738 in data model 700 where i=2. Accordingly, to decode codeword 712, a decoder engine may be arranged to decode the non-control bits portions (rawcodes) of codeword 712. This results in an intermediate value of 38 (0x0100110), and since codeword 712 is a [3,2] codeword that includes two continuation control bit values the decoder engine will add the offset constant of 40 to the intermediate value (rawcode) to produce the final result of 78.

Similarly, codeword 726 illustrates an encoded value for a [2,1] interleaved start-step code encoded using a [2,1] start-step code where the start code has a value of two and the step code has a value of one. In this example, since codeword 726 is encoded using a [2, 1] code, the first 2 bits (bits 728) followed by control bit 730 indicate the start of the code word. Then, the next bit (bit 730 in this case) indicates the end of the codeword, or that at least one more step should be looked for. Here, in this example, bit 730 is 0 (zero), indicating there is at least one more step to consider. In this example, because a [2, 1] code is being used, each data bit "step" is one bit long. Accordingly, the next data bit is bit 732, followed by another control bit (control bit 734). Control bit 734 is 0 (zero) indicating at least one or more step. Bit 736 is the next data bit, followed by control bit 738. Here, in this example, control bit 738 is 1-valued (one) indicating the end of the codeword. Accordingly, codeword 726 may be decoded into an intermediate value of 0x0111. At face value 0x0111 is 7 decimal. However, in some embodiments, a [2, 1] start-step code with two steps (control bit 730 and control bit 734) would be decoded as 12+7=19 decimal since the offset, indicated by the start of the xxxx range is 12. A data model for a [2,1] interleaved start-step code would have a record similar to row 738, except it would contain: i=2, Ci=4, codewords='xx0x0x1', count=2^4, and range=12-27.

In one or more of the various embodiments, encoder engines may be arranged to monitor one or more metrics associated with the performance or operation of the network. Accordingly, in one or more of the various embodiments, if the operation of the network may be less than a threshold, the encoding engine may modify one or more of the start code or the step code. And, if the operation of the network is more than the threshold, the modified the start code or the step code may be restored to their original or previous values.

In one or more of the various embodiments, the start code or step code initial values may be selected based on the expected application for the encoding. In one or more of the various embodiments, the encoder engine may be arranged to obtain the start code or step code from configuration information, rule-based policies, or the like. Likewise, in one or more of the various embodiments, the modifications to the start code or the step code may be obtained from configuration information, rule-based policies, or the like. These values may be determined in advance based on experiment or observation of different applications or different data types.

Also, in one or more of the various embodiments, the physical or geographical location of the encoding engine may be used for selecting start codes or step codes. For example, if the encoding engine is encoding data for a particular radio frequency in a given country, that country may have limitations or restrictions on the power or bandwidth for that frequency. Accordingly, in this example, the encoding engine may be arranged to adapt the start code or step code to accommodate local regulations based in part on its geographical location. Accordingly, in one or more of the various embodiments, GPS 362, or other sensors may be used to provide geographical location information to one or more encoding engines.

Further, in one or more of the various embodiments, one or more encoding engines may be arranged to select start codes or step codes randomly or randomly from within a defined range of values. Accordingly, the encoding engines may be arranged to monitor the encoding performance or efficiency associated with a selected combination of start codes and step codes. In some embodiments, entropy for randomness used for selecting start codes or step codes may be provided based on one or more of GPS 362, sensors 364, or the like.

Illustrative Use Cases

Figure 8:
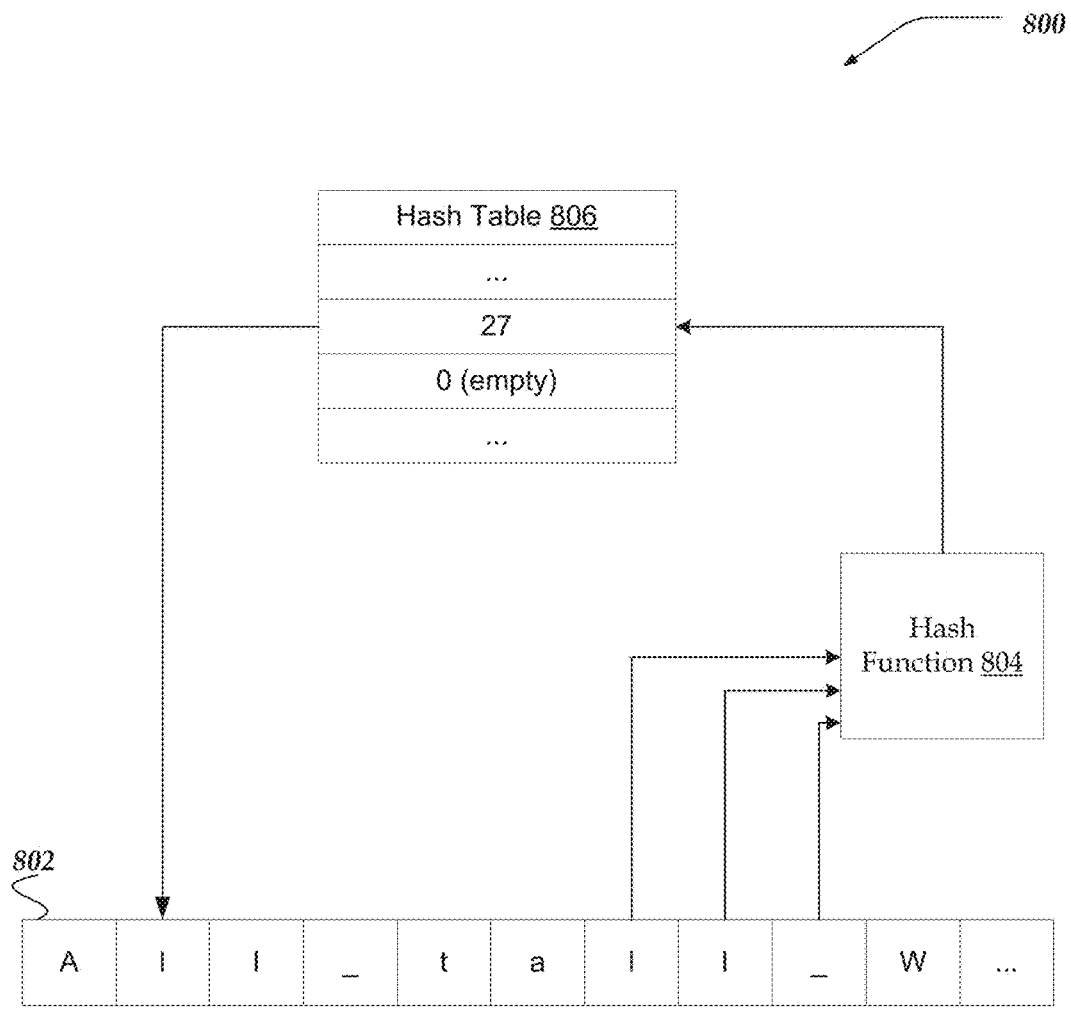
FIG. 8 illustrates a logical schematic of a Lempel-Ziv codec that employs Interleaved Start-Step encoding.

FIG. 8 illustrates a logical schematic 800 of a Lempel-Ziv (LZ) based codec that employs Interleaved Start-Step encoding. As the example below illustrates, the LZ algorithm works by finding character matches from an input stream 802 and sending control codes to an output stream indicating the length and offset where previous matches occurred. The offset is computed by subtracting from the index of the characters being matched, pointing to the end of the previous match, while the length indicates how many of the previous characters match. Unmatched characters are marked and sent verbatim to the output.

Input: All_tall_We_all_are_tall._All_small_We_all_are_small

Output: All_ta[2,3]We_[6,4]are[4,5]._[1,4]sm[6,15][31,5]

(where copy tokens [x,y]=[match offset, match length])

Control codes are typically referred to as copy match offset/length tokens, or simply as copy tokens for short. Unmatched characters in the string are commonly referred to as literals. Literals may be indicated by a bit, or may have their length encoded with another control code. Therefore, the compression ratio not only depends on the string matching strategy used, including the selected hashing scheme if any, but also on the encoding scheme used to represent the control tokens in the output stream. Using the disclosed interleaved start-step encoding to encode both the copy match length/offset values and the copy literal length tokens can significantly improve the compression achieved by traditional LZ techniques.

One embodiment is depicted in FIG. 8. An encoder, such as, encoding engine 326, reads characters 802 into a hash function 804 which produces a hashcode that may be used as an index into a hashtable 806. The hashtable contains indexes to previously encountered strings. A string may be considered found, if characters at the current index match at least three characters at the hashcode index. If found, interleaved start-step encoding may be used to encode the copy match offset/length values and/or the copy literal length tokens.

In one or more of the various embodiments, empirical tests may be employed to discover or confirm the optimal parameters for the interleaved start-step codes as applied to copy match offset/length. Both the copy match length values and the copy literal length tokens were set using interleaved start-step code (0,1), while the copy match offset values were set using interleaved start-step code (0,8).

In one or more of the various embodiments, one or more predefined parameters for the interleaved start-stop codes may be supplied. For example, an encoder may be arranged to use interleaved start-step code (0,1), while the copy match offset values were set using interleaved start-step code (0,8). Likewise, in some embodiments, configuration information may be used to change or vary the parameters for the interleaved start-step codes as applied to copy match offset/length depending. Optimal parameter values may be varied depending on the expected input raw, encoding requirements, host computer word-size, domain range, or the like, or combination thereof.

Figure 9A:
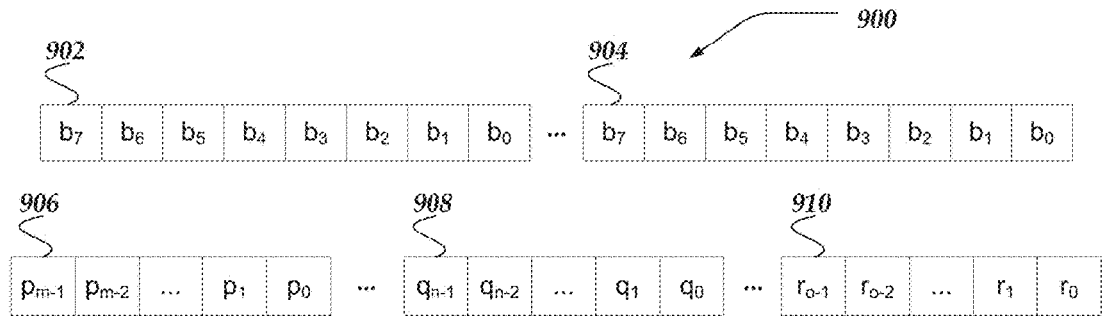
FIG. 9a illustrates a logical schematic of dynamic field headers encoded using Interleaved Start-Step encoding.

FIG. 9A illustrates a logical schematic 900 of dynamic field headers encoded using Interleaved Start-Step encoding. Headers have diverse use in computer and networking applications. File headers store metadata associated with computer applications. Message headers are used in communication protocols to pass connection parameters and session state. In some cases, headers, however, may comprise one or more static fields of fixed length. This assures that fields for a particular protocol or format header will fall on specific offsets, which enforces proper data alignment and simplifies data loads/stores at the computer architecture level. Also, using well-known header formats enables users or applications to confirm a packet, file, stream, document, or the like, is using a particular format, protocol, or the like.

Unfortunately, in some embodiments, fixed length or fixed alignment of header fields may increase the length of the fields and hence the overall header size. In the Internet Protocol suite, for instance, the IP header has a minimum size of 20 bytes and every field has a predetermined length and offset.

However, in some cases, the information passed in such a 20-byte header could be encoded in fewer bytes using a variable-length scheme, thereby reducing the memory space footprint taken by every IP packet on the Internet. One downside may be that the variable length and the variable offset of each field is not known beforehand. The offset needs to be computed first before the field itself can be decoded. The advantage of interleaved start-step codes, though, is that fields can be decoded without knowing their length, or conversely, the length can be determined dynamically while the field is being decoded. For applications where memory is expensive or otherwise premium, reducing memory footprint at the expense of compute costs may be worth the effort. Also, in some embodiments, communication over low-bandwidth systems, such as, Low-Powered Wide-Area Networks (LPWANs), or the like, may be improved by reducing header or payload size at the expense of compute costs using interleaved encoding. Further, in some embodiments, FPGAs, CPLMs, ASICs, PALs, or the like, may be arranged to implement one or more interleaved encoders.

FIG. 9 shows an implementation of dynamic-field headers that is in accordance with one or more of the various embodiments.

The dynamic-field header is divided into two sections:

Dynamic field bit markers 902 ($[b_7 \ldots b_0]$) and 904 ($[b_7 \ldots b_0]$).

Dynamic field contents 906, 908, and 910 ($[p_{m-1} \ldots p_0][q_{n-1} \ldots q_0] \ldots [r_{o-1} \ldots r_0]$).

The dynamic field bit markers encode the presence or absence of specific header fields. If a given bit is 1, the corresponding field is present and encoded later in the stream. If the bit is 0, the field is absent. The markers are encoded in groups of bitfields, which are byte-aligned, from bit7 to bit1. The rightmost bit0 indicates whether another group of bitfields follow. This allows dynamically-extendable header fields. If bit0 is 1, another group of bitfields follows. If bit0 is 0, the field bit markers section ends, and the dynamic field contents start at the next byte.

The dynamic field contents may be encoded sequentially from left to right using specific interleaved start-step codes. The start-step values are chosen beforehand per specific header field and its range of values. After a given header field is encoded, the next field is encoded in the next bit available within that byte. If no bits are available, the next byte is used starting from bit7. After that last header field is encoded, the remaining unused bits from the last byte are ignored.

An example of using interleaved start-step codes for encoding dynamic headers is discussed below. The example header features eight (8) optional fields that can be set or reset dynamically:
- Three-byte magic signature
- Cipher ID
- Compression level
- Source message length
- Encoded message length
- HMAC (hash message authentication code)
- Source buffer length
- Encoded buffer length The extendable bit field markers indicate presence or absence of each header field, while the interleaved start-step codes encode the header field contents, if present. Some bits in the bit field markers are not used as field markers, but rather as option flags:
- Last marker byte
- Encryption enabled
- Compression enabled The bit markers can be specified, say in C language, with the following definitions:
define IS_LASTBYTE 0x01 //no more field bit marker bytes
/* byte 1 contains the following bits: */
define HAS_MAGIC3 0x80 //magic 3-byte signature follows bit markers
define IS_ENCRYPTED 0x40 //encoded block is encrypted
define IS_COMPRESSED 0x20 //encoded block is compressed
define HAS_CIPHERID 0x10 //encoded block has cipher ID (ISS code 2,1)
define HAS_COMPLEVEL 0x08 //encoded block has compression level (ISS code 2,1)
define HAS_SRCTOTLEN 0x04 //has total source length (in bytes) (ISS code 5,2)
define HAS_ENCTOTLEN 0x02 //has total encoded length (in bytes) (ISS code 5,2)
/* byte 2 contains the following bits: */
define HAS_HMAC 0x80 //has hash message authentication code (ISS code 8,8)
define HAS_SRCBUFLEN 0x40 //has source buffer length (in bytes) (ISS code 7,3)
define HAS_ENCBUFLEN 0x20 //has encoded buffer length (in bytes) (ISS code 7,3)

The IS_LASTBYTE flag, if not set, extends the bit field markers to the next byte. The contents of each header field are encoded with a specific interleaved start-step (ISS) code—whose values are specified in the line comments above.

Figure 9B:
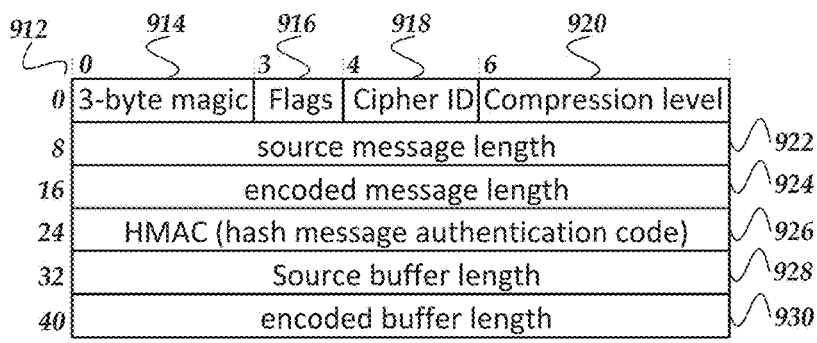
FIG. 9b illustrates an example of a static header.
Figure 9C:
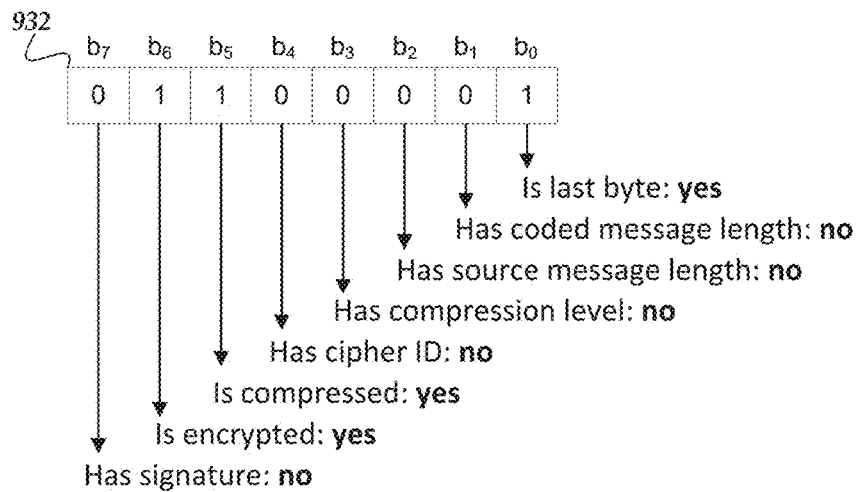
FIG. 9c illustrates an example of a minimal dynamic header.
Figure 9D:
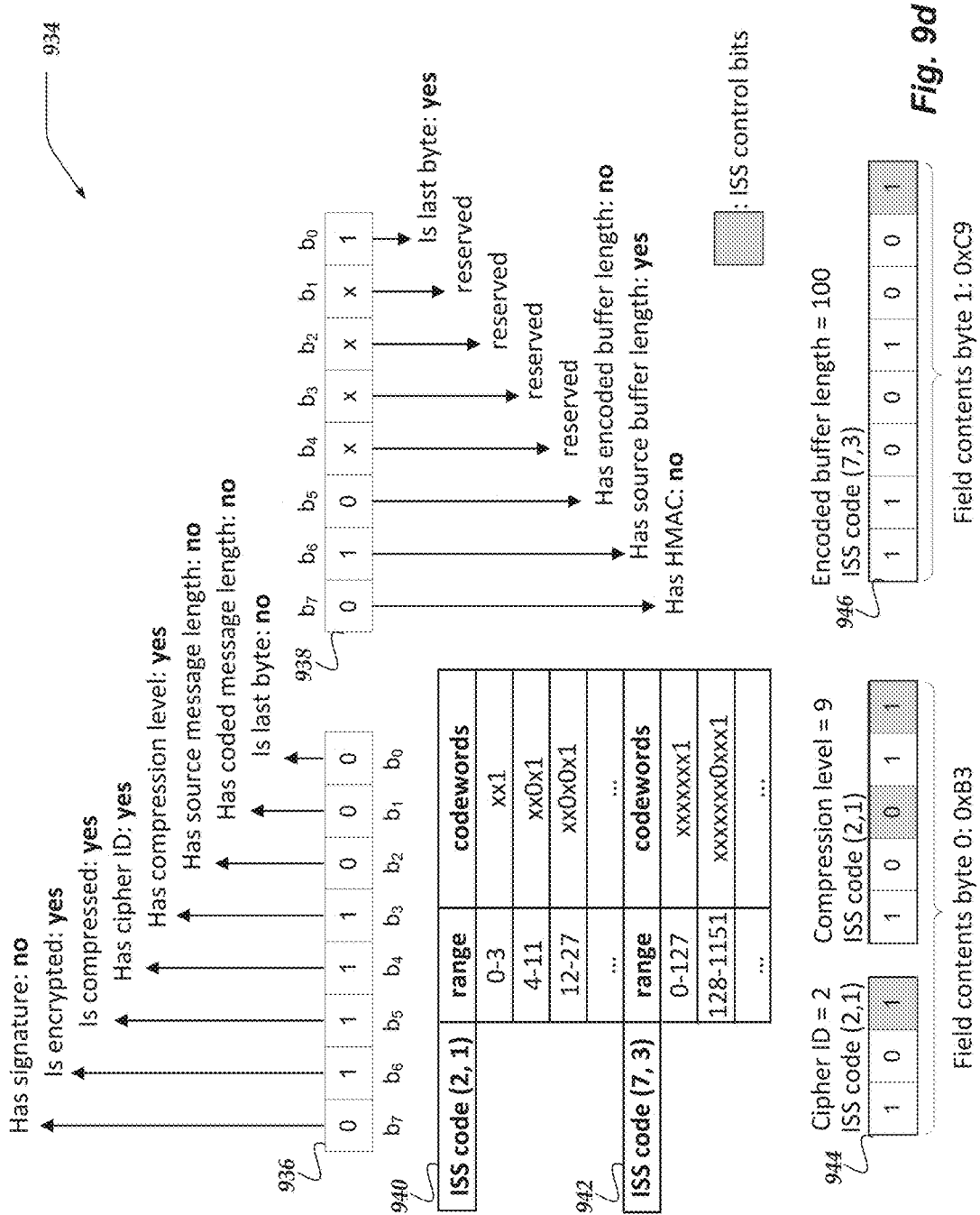
FIG. 9d illustrates an example of a three-field dynamic header.

With the above definitions, it is possible to create several dynamic instances of the header. Three (3) examples are provided: Example 1, depicted in FIG. 9b, is a static header, provided for comparison purposes only, that shows the standard way to encode a header using static fields and offsets; Example 2, depicted in FIG. 9c, is a minimal header, that features a 1-byte header with default field values and no physical field contents; and Example 3, depicted in FIG. 9d, is a header with three fields, which encodes three fields by extending the bit field markers to two bytes, and using specific interleaved start-step codes for the marked fields.

Example 1: Static Header

FIG. 9b illustrates an example of a static header 912. Static header 912 includes all fields defined in its corresponding data structure, i.e. 3-byte magic 914, flags 916, cipher ID 918, compression level 920, source message length 922, encoded message length 924, HMAC (hash message authentication code) 926, Source buffer length 928, and encoded buffer length 930. The advantage is that any field can be loaded/stored with ease since it has a specific length and offset. The disadvantage is that all fields are included even if they are not applicable, increasing the space footprint for both storage and transmission. Note that static header 912 has a fixed space footprint of 48 bytes, which cannot change.

Example 2: Minimal Header

FIG. 9c illustrates an example of a minimal dynamic header 932. By disabling all optional header fields, thereby relying on default preset values, it is possible to encode a minimal sized header. The bit field markers would all fit in the first byte, and the header field contents would be absent. As such, the minimal sized header would only consume 1 byte. This in contrast with a full static header which would take as many bytes as fields and lengths are defined in the header data structure, and, which as described above, could encode the same information in 48 bytes.

In this example, the following header field bits are set in the following bytes:
Field marker byte 0:
  is encrypted (0x40), is compressed (0x20), and is last byte (0x01)
The following field contents are encoded:
None
As such, the header byte stream is:
0x61←space footprint: 1 byte.

Example 3: Three-Field Header

FIG. 9d illustrates an example of a three-field dynamic header 934. This header selectively encodes only three (3) fields: the compression level 920, the cipher ID 918, and the encoded message length 924. Note that since the latter field is encoded in bit6 of the second marker byte, the field markers must be extended by resetting bit0 of the first marker byte. As such, marker bytes 936 and 938 are both included in the output stream.

In this example, by convention, cipher ID 918 and compression level 920 are encoded with ISS code 940 (2, 1), while encoded buffer length is encoded with ISS code 942 (7, 3). These are example values, empirically derived, and other values are similarly contemplated.

In this example, the following header field bits are set in the following bytes:
Field marker byte 0:
  is encrypted (0x40), is compressed (0x20), has cipher ID (0x10), has compression level (0x08)
Field marker byte 1:
  has source buffer length (0x40), is last byte (0x01)
The following field contents are encoded with ISS codes:
cipher ID=2. As encoded with an ISS of (2, 1), the result is stored in byte stream 944 (0b101).
compression level=9. As encoded with an ISS of (2, 1), the result is stored in byte stream 946 (0b10011).
source buffer length=100. As encoded with an ISS of (7, 3), the result is stored in byte stream 948 (0b11001001).
The field contents are concatenated, one after another, without padding, resulting in bytes 0xB3 and 0xC9. As such, the header byte stream is:
0x78, 0x41, 0xB3, 0xC9←space footprint: 4 bytes.

Generalized Operations

FIGS. 10-14 represent the generalized operations for interleaved start-step encoding in accordance with at least one of the various embodiments. In one or more of the various embodiments, processes 1000, 1100, 1200, 1300, and 1400 described in conjunction with FIGS. 10-14 may be implemented by and/or executed on a single network computer, such as network computer 300 of FIG. 3. In other embodiments, these processes or portions thereof may be implemented by and/or executed on a client computer, such as one or more of client computers 102-105 of FIG. 1. However, embodiments are not so limited, and various combinations of network computers, client computers, virtual machines, or the like may be utilized.

Figure 10:
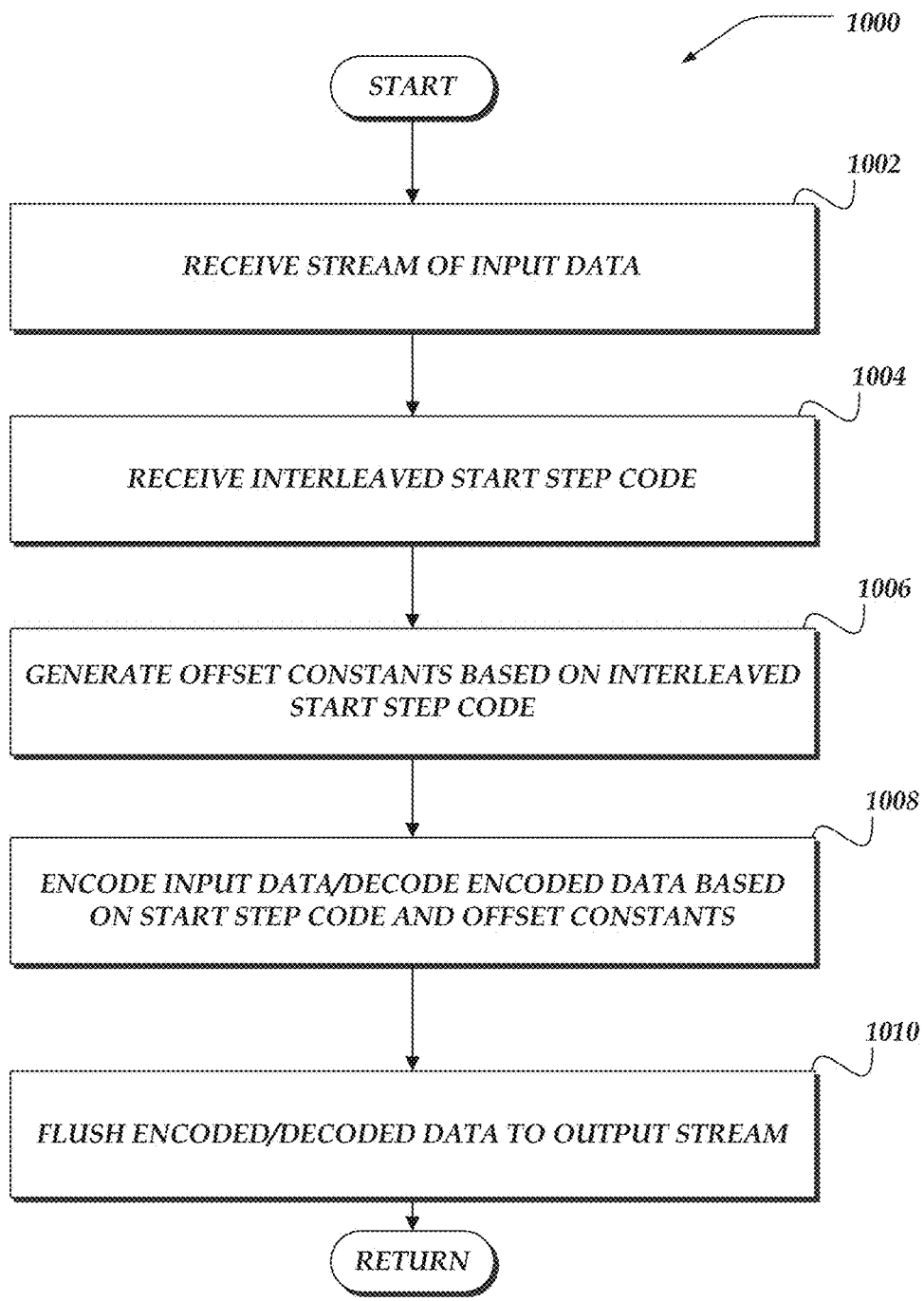
FIG. 10 illustrates a flowchart for a process for encoding a stream of input data using Interleaved Start-Step codes.

FIG. 10 illustrates an overview flowchart for process 1000 for interleaved start-step encoding/decoding in accordance with one or more of the various embodiments. Process 1000 may be implemented and executed by, for example, network computer 116 as depicted by network computer 300 of FIG. 3. However, other computers, including client computers 102-104 as depicted by client computer 200 of FIG. 2, are also performing the operations described below in conjunction with FIG. 10.

After a start block, at block 1002, a stream of input data is received. In one or more of the various embodiments the stream of input data includes a series of integers. However, any other type of source symbol, or combination of types of source symbols, is similarly contemplated. For example, the stream of input data may include a series of characters (e.g. Unicode characters), serialized objects, or any other type of data.

In one or more of the various embodiments the source symbols are encoded with a fixed-width encoding. For example, the series of integers may comprise a series of 64-bit integers, however 32 bit, 16 bit, or any other fixed width is similarly contemplated. Similarly, a series of Unicode characters may include a series of 16-bit Unicode characters. However, the input data may also comprise a series of variable width encoded source symbols, such as Universal Transformation Format-8-bit (UTF-8) Unicode characters.

At block 1004, an interleaved start-step code (ISS code) is provided. In one or more of the various embodiments, the ISS code defines a number of "start" bits and a number of "step" bits. The number of "start" bits defines how many bits in a codeword, if any, precede the first control bit. For example, if a start value is 4, then a codeword may begin with "xxxx0 . . . ", where each x is a data bit of the rawcode and the 0 is the first control bit. However, if the source symbol can be encoded in only 4 bits, then the codeword would have the form "xxxx1", in which the "1" control bit indicates the end of the codeword.

Similarly, the number of "step" bits defines how many bits in a codeword precede subsequent control bits. Continuing the example, a step value of 3 would result in a codeword such as ""xxxx0xxx1", ""xxxx0xxx0xxx1", or generally, "xxxx0xxx0xxx0 . . . xxx1".

In one or more of the various embodiments, the particular ISS code provided may be selected based on the one or more characteristics of the application, input stream, or the like. In some embodiments, encoding engines may be arranged to apply one or more policy rules that select an ISS code based on one or more characteristic of the input stream, such as, owner, source, type-of-data (e.g., text vs. video), computer word size, known min-max of input values, user provided inputs, or the like, or combination thereof. For example, a policy rule may define the ISS codes for one or more applications that may be associated with the input stream. Likewise, in some embodiments, ISS codes may be selected such that they support a known maximum range or value or input. For example, in some embodiments, even though a host computer supports 64-bit word sizes, a user may know that their application provides 16-bit raw data. Thus, in this example, ISS codes may be selected for representing 16-bit values rather than 64-bit values.

At block 1006, offset constant c1 is generated based on the interleaved start-step code received in block 1004. Constant c1 may be used in one embodiment to incrementally convert a value to a rawcode (or to convert a rawcode to a value). While the process of incrementally converting a value to a rawcode is discussed in more detail below in conjunction with block 1008, briefly, constant c1 can be used to incrementally modify a value as it is being converted to a rawcode. Specifically, in one or more of the various embodiments, bits are processed in bunches. The first bunch has as many bits as the "start" portion of the interleaved start-step code, while subsequent bunches have as many bits as the "step" portion of the interleaved start-step code (it is also contemplated that "start" and "step" are equal). Constant c1 typically has as many bits as the bunches it is applied to. Depending on the operation (e.g., encoding or decoding), c1 is subtracted from or added to bunches of bits as they are processed, without storing temporary results. This incremental conversion technique may reduce memory constraints by using fewer variables, and increasing encoding/decoding speed by dynamically calculating rawcodes/values on the fly, respectively. These benefits may have huge impacts on memory, processing, and power, especially on resource constrained devices. For example, reducing the use of temporary variables may decrease CPU usage, as fewer loads and stores are required to implement the disclosed innovations. Similarly, less memory is consumed, as results may be accumulated in a small number of variables.

In one or more of the various embodiments, a constant c2 may be derived and similarly used to incrementally convert a value to a rawcode, or vice-versa. In one embodiment, constant c2 is the one's complement of constant c1. While the exact formula applied to constant c2 differs from the formula applied to constant c1, the general idea is similar.

To derive c1 and/or c2, it is helpful to first derive constants k1 and k2, which are constants used to calculate an entire rawcode from a given value, as in either of the following equations:

$$1/\text{rawcode} = \text{value} + k1 \qquad (1) \text{ or}$$

$$0/\text{rawcode} = \text{value} - k2 \qquad (2)$$

Equations (1) and (2) are equivalent, and may be used interchangeably to calculate a rawcode from a given value. In order to decode a value from a rawcode, one of the two following equations can be solved to obtain "value":

$$\text{value} = 1/\text{rawcode} - k1 \qquad (3) \text{ or}$$

$$\text{value} = 0/\text{rawcode} + k2 \qquad (4)$$

As with equations (1) and (2), equations (3) and (4) are equivalent and interchangeable. For all of these equations, "b/rawcode" means a bit "b" prepended to the "rawcode".

Constant k1 and k2 depend solely on the number of bits used to represent the "rawcodes". That is, for integer values that have rawcodes with the same number of bits, k1 and k2 will remain constant. For instance, for the ISS code (2,2), all integer values ranging from 20 to 83 will have rawcodes 6 bits long, which results in a constant difference between the values and their rawcodes of k1=101100 (44), and k2=10100 (20), for all integers between 20 and 83.

Equations (1) and (3) are rearrangements of each other; one is used for encoding while the other for decoding. Equations (2) and (4), similarly, are rearrangements of each other. The difference between (1) and (2) or equivalently (3) and (4), is that (1) and (3) calculate rawcodes and the integer values respectively, by adding or subtracting constant k2, while (2) and (4) use constant k1, which is the two's-complement value of k2. The reason for this is that calculations for (1) or (3) (the two's-complement versions) could prove to be somewhat simpler than (2) or (4), or vice-versa.

The following table shows k1 and k2 for ISS code (2,2):

| range of integers | codewords | k1 | k2 (= −k1) |
|---|---|---|---|
| 0-3 | xx1 | 1 00 | 0 |
| 4-19 | xx0xx1 | 11 00 | 1 00 |
| 20-83 | xx0xx0xx1 | 10 11 00 | 1 01 00 |
| 84-339 | xx0xx0xx0xx1 | 10 10 11 00 | 1 01 01 00 |
| . | . | . | . |
| . | . | . | . |

From the table above it is clear that a pattern begins from bit 3 for k1, and from bit 1 for k2 (the bits are zero-based). The following table now shows a slightly different pattern for ISS code (3,3):

| range of integers | codewords | k1 | k2 (= −k1) |
|---|---|---|---|
| 0-7 | xxx1 | 1 000 | 0 |
| 8-71 | xxx0xxx1 | 111 000 | 1 000 |
| 72-583 | xxx0xxx0xxx1 | 110 111 000 | 1 001 000 |
| 84-4679 | xxx0xxx0xxx0xxx1 | 110 110 111 000 | 1 001 001 000 |
| . | . | . | . |
| . | . | . | . |

A similar pattern occurs for this ISS value. However, because there is no apparent pattern in which the bits of k1 are the same for each bunch of bits in the codeword, the values for k1 and k2 cannot be used remove dynamically, e.g. iteratively, to translate an integer value into a rawcode or vice-versa. However, c1 and c2 can be derived to obtain a full pattern starting from bit 0 by changing variables:

$$c1 = k1 - 2 \quad (5)$$

$$c2 = k2 + 1 \quad (6)$$

Thus changing variables, equations (1), (2), (3), and (4) become:

```
1/rawcode = (value + 2) + c1    (7) or
0/rawcode = (value + 1) − c2    (8) both for encoding
and,
value = (1/rawcode − c1) − 2    (9) or
value = (1/rawcode − c1) − 2    (10) both for decoding
```

The following tables apply eqs. (5) and (6) to ISS codes of (2, 2) and (3, 3), which yield:

| ISS code (2, 2): | | | |
|---|---|---|---|
| range of integers | codewords | c1 | c2 (= not c1) |
| 0-3 | xx1 | 10 | 1 |
| 4-19 | xx0xx1 | 10 10 | 1 01 |
| 20-83 | xx0xx0xx1 | 10 10 10 | 1 01 01 |
| 84-339 | xx0xx0xx0xx1 | 10 10 10 10 | 1 01 01 01 |
| . | . | . | . |
| . | . | . | . |

| ISS code (3, 3): | | | |
|---|---|---|---|
| range of integers | codewords | c1 | c2 (= not c1) |
| 0-7 | xxx1 | 110 | 1 |
| 8-71 | xxx0xxx1 | 110 110 | 1 001 |
| 72-583 | xxx0xxx0xxx1 | 110 110 110 | 1 001 001 |
| 84-4679 | xxx0xxx0xxx0xxx1 | 110 110 110 110 | 1 001 001 001 |
| . | . | . | . |
| . | . | . | . |

By induction it can be proven that for ISS code (n,n), c1 and c2 become:

| range of integers | codewords |
|---|---|
| $0$-$2^n - 1$ | x..x1 |
| $2^n$-$2 \cdot (2n) + 2^n - 1$ | x..x0x..x1 |
| $2 \cdot (2n) + 2^{n-2} \cdot (3n) + 2 \cdot (2n) + 2^n - 1$ | x..x0x..x0x..x1 |
| $2 \cdot (3n) + 2 \cdot (2n) + 2^{n-2} \cdot (4n) + 2 \cdot (3n) + 2 \cdot (2n) + 2^n - 1$ | x..x0x..x0x..x0x..x1 |
| . | . |
| . | . |

| c1 | c2 (= not c1) |
|---|---|
| 1..10 | 0..01 |
| 1..10 1..10 | 0..01 0..01 |
| 1..10 1..10 1..10 | 0..01 0..01 0..01 |
| 1..10 1..10 1..10 1..10 | 0..01 0..01 0..01 0..01 |

In one or more of the various embodiments, these values of c1 and c2 are used to encode/decode a value, as described below with regard to block 1008.

Irregular Interleaved Start-Step

In one or more of the various embodiments, an interleaved start-step code may be divided into groups of data bits that are different in length, yet according to a pattern. For example, an ISS of (1,(1, 2, 3, . . . )), in which each subsequent group of data bits is one longer than the previous, would generate this pattern:

| range of integers | codewords |
|---|---|
| 0-1 | x1 |
| 2-9 | x0xx1 |
| 10-73 | x0xx0xxx1 |
| 74-1097 | x0xx0xxx0xxxx1 |
| . | . |
| . | . |

This is not an interleaved start-step code according to the definition given above. However, it is a variable-length code, and similar techniques can be applied to encode/decode a value. Other groupings are similarly contemplated—the number of ways of grouping data bits with control bits are virtually limitless.

At block 1008, input data is encoded or codewords are decoded based on the interleaved start-step code and the generated offset constants. In one or more of the various embodiments, offset constants k1 or k2 are used by equations (1)-(4) to convert an integer value to a rawcode or vice-versa. When using constants k1 or k2 to encode a value, the integer value is first converted to a rawcode, and then the rawcode is interleaved with control bits. Similarly, when decoding an encoded value using equations (1)-(4), the rawcode must first be extracted from the codeword, after which conversion to the integer value can be performed. Example embodiments of encoding and decoding using constants k1 or k2 and equations (1)-(4) are discussed below in conjunction with FIGS. 11 and 12, respectively.

In another embodiment, offset constants c1 or c2 are used by equations (7)-(10) to incrementally convert integer values to rawcodes and vice-versa. Incremental encoding does not require the separate steps of converting to a rawcode followed by interleaving control bits. Similarly, incremental decoding does not require extracting a rawcode from a codeword followed by converting to the integer value. Rather, incremental encoding/decoding means that control bits are evaluated and offset constants (i.e. c1 or c2) are applied in the same pass, without storing intermediate results in separate, temporary variables.

Specifically, data bits are grouped based on the start and step portions of the interleaved start-step code, and encoded/decoded incrementally based on these groupings. Because offset constants c1 and c2 were derived to exhibit patterns based on a given start-step code, and because the pattern has the same number of bits as each group of data bits, the same pattern can be applied to each group of data bits as they are encountered. This is true for an arbitrary number of groups of data bits—any number of groups of data bits can have the same pattern applied, until a "1" control bit is encountered and the result is obtained. In this way, decoding/encoding is performed in a single pass in which groups of data bits are identified and incrementally converted based on c1 (or c2).

For example, ISS(3,3) has a pattern of xxx0xxx0 . . . xxx1, and so data bits are divided into groups of 3. The corresponding value of c1 is 110110 . . . 110, which can also be divided into groups of 3, the repeating pattern of "110". By having the same number of bits, each group of data bits may be processed by applying, according to one of equations (7) (for encoding) or (9) (for decoding), "110" to each of the groups of data bits. In this way, arbitrary lengths of values/rawcodes may be encoded/decoded, as each additional group of data bits is processed by applying c1 for another iteration.

Example embodiments of encoding and decoding using constants c1 or c2 and equations (7)-(10) are discussed below in conjunction with FIGS. 13 and 14, respectively.

Example Decoding Embodiments

The following are descriptions of logic that may be performed by at least one of the various embodiments. These examples further clarify one or more features of at least one of the various embodiments. These embodiments may be implemented using functions, methods, data structures, variable names, control structure, or the like, other than those described below. For example, one of ordinary skill in the art will appreciate that the innovations disclosed herein may be implemented using various programming styles, such as, functional programming, imperative programming, object-oriented programming, or the like, or combination thereof. Further, one of ordinary skill in the art will appreciate that one or more embodiments may be implemented using various computer programming languages, such as, Python, Perl, C, C++, C#. Java, Javascript, Haskell, Clojure, Ruby, Scala, custom languages, or the like, or combination thereof.

Further, in one or more embodiments (not shown in the figures), the logic illustrated in these examples may be executed using an embedded logic hardware device instead of a CPU, such as, an Application Specific Integrated Circuit (ASIC), Field Programmable Gate Array (FPGA), Programmable Array Logic (PAL), or the like, or combination thereof. The embedded logic hardware device may directly execute its embedded logic to perform actions. In at least one embodiment, a microcontroller may be arranged to directly execute its own embedded logic to perform actions and access its own internal memory and its own external Input and Output Interfaces (e.g., hardware pins and/or wireless transceivers) to perform actions, such as System On a Chip (SOC), or the like. Accordingly, the below shown pseudo-code examples are included to provide clarity and/or refinement in regard to one or more of the embodiments described above.

The following "C language" and "x86 assembly language" code fragments implement versions of the decoding algorithm described above. Examples are given for ISS code (1,1) and ISS code (2,2). Other implementations, including implementations in which the start code differs from the step code, are similarly contemplated. One of ordinary skill in the art will understand that the algorithms, languages, and syntax that follow are example implementation, but that other algorithms, languages, and syntax are similarly contemplated by the claimed embodiments. For example, the following exemplary embodiments are limited, for efficiency reasons, to codewords of 32 bits in length. However, other embodiments that encode an integer using more than 32 bits are similarly contemplated. For example, using a 64-bit integer, a similar algorithm could encode a codeword in up to 64 bits. However, other algorithms contemplated by the claimed embodiments could encode a codeword across multiple integers (whether the integers were defined by the compiler as 16-bit, 32-bit, 64-bit, or the like). Other embodiments contemplated swapping the meaning of control bits "1" and "0". In the following embodiments, a control bit of "1" indicates that the last data bits have been encountered. However, it is also contemplated that a "0" indicates that the last data bits have been encountered.

First, the following "C" macros and "ASM" functions will be used throughout all the versions of the decoding algorithm:

```
(C lang.)
  #define GetBitFromToken                              \
  {                                                    \
    bit = token;                                       \
    token <<= 1;                                       \
    if (token == 0) {                                  \
      bit = *((int *)ip)++;                            \
      token = (bit << 1) + 1;                          \
    }                                                  \
    bit >>= 31;                                        \
  }
  #define AppendBitToValue                             \
  {                                                    \
    value = (value << 1) + bit;                        \
  }
  #define GetBitFromToken_AppendBitToValue             \
  {                                                    \
    GetBitFromToken( );                                \
    AppendBitToValue( );                               \
  }
```

```
(80386+ assembly)
AppendBitToValue macro
    rcl    ecx, 1
endm
GetBitFromToken_AppendBitToValue:
    call   GetBitFromToken
    AppendBitToValue
    ret
GetBitFromToken_AppendBitToValue_GetBitFromToken:
    call   GetBitFromToken
AppendBitToValue_GetBitFromToken:
    AppendBitToValue
GetBitFromToken:
    shl    eax, 1
    .if    zero?
        lodsd
        stc
        rcl       eax, 1
    .endif
    ret
```

The following are example implementations of a decoder for ISS(1,1). Codewords encoded using ISS(1,1) are formatted according to the following table:

| range of integers | codewords |
|---|---|
| 0-1 | x1 |
| 2-5 | x0x1 |
| 6-13 | x0x0x1 |
| 14-29 | x0x0x0x1 |
| 30-62 | x0x0x0x0x1 |
| . | . |
| . | . |

First, one C language implementation of a decoder based on equation (9), "value=(1/rawcode−c1)−2", for ISS (1,1):

```
value=1;
do {
  GetBitFromToken_AppendBitToValue ( );
  GetBitFromToken ( );
} while (bit==0);
// range of ints (value): 2-3, 4-7, 8-15, 16-31, 32-64, . . .
--value;
// range of ints (value): 1-2, 3-6, 7-14, 15-30, 31-63, . . .
--value;
// range of ints (value): 0-1, 2-5, 6-13, 14-29, 30-62, . . .  --value ^=−1
// range of ints (value): −1 to −2, −3 to −6, −7 to −14, . . .
```

This block of code begins by setting the variable "value" to "1". "value" represents the result, i.e. the output of the decoder. "value" is iteratively constructed <step> bits at a time, which for ISS(1,1) is one bit at a time. As "value" is constructed, existing bits are shifted to the left (see AppendBitToValue above). Thus, by initializing "value" to "1", "value" has a "1" prepended, implementing the "1/rawcode" term of equation (9).

The code continues with a do . . . while loop, iteratively extracting bits from "token" (the codeword). Because this code implements ISS(1,1), the codeword has the pattern "x0x0 . . . x1". As such, each iteration extracts two bits—the first bit (representing an "x", part of the rawcode) is appended to the value, while the second bit (representing a "0" or a "1") is a control bit. The control bit is tested in the "while" expression to determine if the codeword has ended (bit==1) or if the codeword continues (bit==0). Note that, because for ISS(1,1), c1==0, the "−c1" term, which would otherwise be included in each iteration of the do . . . while loop, is omitted as an optimization.

Following the do . . . while loop, value is decremented twice, implementing the "−2" term, leaving the decoded integer in the "value" variable.

The following statement, "value ^=−1", takes the one's complement of value, giving the final decoded result.

The following code implements an example embodiment of a C language implementation of a decoder based on equation (10), "value=(0/rawcode+c2)−1", for ISS (1,1):

```
value=0;
do {
  GetBitFromToken_AppendBitToValue ( );
  ++value;
  GetBitFromToken ( );
} while (bit==0);
// range of ints (value): 1-2, 3-6, 7-14, 15-30, 31-63, . . .
--value;
// range of ints (value): 0-1, 2-5, 6-13, 14-29, 30-62, . . .
```

This implementation echoes the implementation of equation (9) for ISS(1,1) discussed above, with the following differences. Instead of prepending a 1, a 0 is prepended to the value, implementing the "0/rawcode" term. Instead of optimizing out "−c1", the body of the do . . . while loop includes "++value", implementing the "+c2" term. Instead of decrementing "value" twice, "value" is only decremented once, implementing the "−1" term.

The following listing includes one example implementation of a decoder based on each of equations (9) and (10) for ISS (1,1) in 80386+ assembly language:

(1st version: "value=(1/rawcode−c1)−2")   eq. (9)

```
xor ecx, ecx
inc ecx
.repeat
    call   GetBitFromToken_AppendBitToValue_GetBitFromToken
.until carry?
; range of ints (ecx): 2-3, 4-7, 8-15, 16-31, 32-64, . . .
dec ecx
; range of ints (ecx): 1-2, 3-6, 7-14, 15-30, 31-63, . . .
dec ecx
; range of ints (ecx): 0-1, 2-5, 6-13, 14-29, 30-62, . . .
not ecx
; range of ints (ecx): −1 to −2, −3 to −6, −7 to −14, . . .
```

(2nd version: "value=(0/rawcode+c2)−1")   eq. (10)

```
xor ecx, ecx
.repeat
    call   GetBitFromToken_AppendBitToValue_GetBitFromToken
    inc ecx
.until carry?
; range of ints (ecx): 1-2, 3-6, 7-14, 15-30, 31-63, . . .
dec ecx
; range of ints (ecx): 0-1, 2-5, 6-13, 14-29, 30-62, . . .
not ecx
; range of ints (ecx): −1 to −2, −3 to −6, −7 to −14, . . .
```

The following are example implementations of a decoder for ISS(2,2). Codewords encoded using ISS(2,2) are formatted according to the following table. This is but one embodiment, and other embodiments with more or fewer or different start codes and/or step codes are similarly contemplated:

| range of integers | codewords |
|---|---|
| 0-3 | xx1 |
| 4-19 | xx0xx1 |
| 20-83 | xx0xx0xx1 |
| 84-339 | xx0xx0xx0xx1 |

In this embodiment, according to the derivation above for ISS(2,2), c1 is known to be "0b10" or 2, while c2 is known to be "0b01" or 1. As such, one C language implementation of a decoder based on equation (9), "value=(1/rawcode−c1)−2" is:

```
value=1;
do {
    GetBitFromToken_AppendBitToValue( ); // 2 times
    GetBitFromToken_AppendBitToValue( ); //
    value-=2;
    GetBitFromToken( );
} while (bit==0);
// range of ints (value): 2-5, 6-21, 22-85, 86-341, . . .
--value;
// range of ints (value): 1-4, 5-20, 21-84, 85-340, . . .
--value;
// range of ints (value): 0-3, 4-19, 20-83, 84-339, . . .
value ^=−1
// range of ints (value): −1 to −2, −3 to −6, −7 to −14, . . .
```

This implementation echoes the implementation of equation (9) for ISS(1,1) described above. One difference is that, because <step>=2, there are two rawcode bits preceding each control bit, and so within the do . . . while loop there are two calls to "GetBitFromToken_AppendBitToValue". Another difference is that, because c1=2, "−c1" is implemented as "value−=2;". This statement is executed for each iteration of the loop, and as such the conversion from rawcode to value is performed incrementally, without storing values in temporary variables.

One example C language implementation of a decoder based on equation (10), "value=(0/rawcode+c2)−1", for ISS (2,2) is:

```
value=0;
do {
    GetBitFromToken_AppendBitToValue( ); // 2 times
    GetBitFromToken_AppendBitToValue( ); //
    ++value;
    GetBitFromToken( );
} while (bit==0);
// range of ints (value): 1-4, 5-20, 21-84, 85-340, . . .
--value;
// range of ints (value): 0-3, 4-19, 20-83, 84-339, . . .
value ^=−1
// range of ints (value): −1 to −2, −3 to −6, −7 to −14, . . .
```

Similar to the implementation above, "GetBitFromToken_AppendBitToValue" is executed twice in the do . . . while loop because each step includes two data bits. However, as c2 is known to be "1", "value" is incremented once within the do . . . while loop, instead of being decremented twice. Similarly, after the do . . . while loop, "value" is only decremented once in accordance with equation (10).

The following listing includes one implementation of a decoder based on each of equations (9) and (10) for ISS (2,2) in 80386+ assembly language:

(1st version: "value=(1/rawcode−c1)−2")     eq. (9)

```
    xor ecx, ecx
    inc ecx
.repeat
    call    GetBitFromToken_AppendBitToValue_GetBitFromToken
    call AppendBitToValue_GetBitFromToken
    dec ecx; does not modify CY flag
    dec ecx; does not modify CY flag
.until carry?
; range of ints (ecx): 2-5, 6-21, 22-85, 86-341, . . .
    dec ecx
; range of ints (ecx): 1-4, 5-20, 21-84, 85-340, . . .
    dec ecx
; range of ints (ecx): 0-3, 4-19, 20-83, 84-339, . . .
    not ecx
; range of ints (ecx): −1 to −2, −3 to −6, −7 to −14, . . .
```

(2nd version: "value=(0/rawcode+c2)−1")     eq.(10)

```
    xor ecx, ecx
.repeat
    call    GetBitFromToken_AppendBitToValue_GetBitFromToken
    call AppendBitToValue_GetBitFromToken
    inc ecx; does not modify CY flag
.until carry?
; range of ints (ecx): 1-4, 5-20, 21-84, 85-340, . . .
    dec ecx
; range of ints (ecx): 0-3, 4-19, 20-83, 84-339, . . .
    not ecx
; range of ints (ecx): −1 to −2, −3 to −6, −7 to −14, . . .
```

Example Encoding Embodiments

The following "C language" and "x86 assembly language" code fragments implement versions of the encoding algorithm described above. Examples are given for ISS code (1,1) and ISS code (2,2). Other implementations, including implementations in which the start code differs from the step code, are similarly contemplated. One of ordinary skill in the art will understand that the algorithms, languages, and syntax that follow are example implementations, but that other algorithms, languages, and syntax are similarly contemplated by the claimed embodiments. For example, the following exemplary embodiments are limited, for efficiency reasons, to codewords of 32 bits in length. However, other embodiments that encode an integer using more than 32 bits are similarly contemplated. For example, using a 64-bit integer, a similar algorithm could encode a codeword in up to 64 bits. However, other algorithms contemplated by the claimed embodiments could encode a codeword across multiple integers (whether the integers were defined by the compiler as 16-bit, 32-bit, 64-bit, or the like).

First, the following "C" macros and "ASM" functions will be used throughout all the versions of the encoding algorithm:

```
(C lang.)
#define AppendBitToToken                                        \
{                                                               \
    token = ((bit = token) >> 1) + (bit << 31);                 \
    if ((bit & 1) != 0) {                                       \
        *((int *)op)++ = token;                                 \
        token = 1 << 31;                                        \
        bit = 0;                                                \
    }                                                           \
} // 'bit' must always be ZERO after this function. .
#define GetBitFromValue                                         \
{                                                               \
    bit = value;                                                \
    value >> = 1;                                               \
}
```

```
#define GetBitFromValue_AppendBitToToken            \
{                                                   \
    GetBitFromValue( );                             \
    AppendBitToToken( );                            \
}
(80386+ assembly)
GetBitFromValue macro
        shr    ecx, 1
endm
AppendBitToToken_GetBitFromValue_AppendBitToToken:
        call   AppendBitToToken
GetBitFromValue_AppendBitToToken:
        GetBitFromValue
AppendBitToToken:
        rcr    eax, 1
        .if    carry?
            stosd
            mov eax, 80000000h    ; mov al,1     ; xor eax,eax
        .endif                    ; shl eax,31   ; stc
        ret                                      ; rcr eax,1
(*) AppendBitToToken:   (always returns CY flag reset)
        rcr    eax, 1
        .if    carry?
            stosd
            mov    al,1           ; or:          xor eax,eax
            shl    eax, 31        ;              stc
        .endif                    ;              rcr eax,1
        ret
```

The following are example implementations of an encoder for ISS(1,1). Codewords encoded using ISS(1,1) are formatted according to the following table:

| range of integers | codewords |
|---|---|
| 0-1 | x1 |
| 2-5 | x0x1 |
| 6-13 | x0x0x1 |
| 14-29 | x0x0x0x1 |
| 30-62 | x0x0x0x0x1 |
| . | . |
| . | . |
| . | . |

First, one C language implementation of an encoder based on equation (7), "1/rawcode=(value+2)+c1", for ISS (1,1), is:
// range of ints (value): −1 to −2, −3 to −6, −7 to −14, . . .
value ^=−1
++value;
// range of ints (value): 1-2, 3-6, 7-14, 15-30, 31-63, . . .
++value;
// range of ints (value): 2-3, 4-7, 8-15, 16-31, 32-64, . . .
token=1<<31;
bit=1;
do {
    AppendBitToToken( ); //'1' on 1st pass, then '0's . . .
    GetBitFromValue_AppendBitToToken( );
} while (value !=1); // "while (value>=2)" is ok too.

In one or more of the various embodiments, values may be encoded with their one's complement (i.e. changing all 1 bits to 0s and all 0 bits to 1s). In these embodiments, encoding may begin with the statement "value ^=−1". As discussed above, this has the effect of changing all 1 bits to 0s and all 0 bits to 1s.

The block of code continues by incrementing "value" twice, thereby implementing the "+2" term. For encoding, the "value" variable represents the input, e.g. the integer to be encoded, while the output, i.e. the codeword, is stored in the "token" variable.

Next, "token" is initialized to "1<<31", meaning a "1" shifted left 31 times to form the value "0b10000000000000000000000000000000" (1 followed by 31 0s). In this embodiment 1 is shifted left 31 times because the compiler is set to output 32-bit code. In general, the token is initialized with the most significant bit set to 1, and all other bits set to 0.

Next, the "bit" variable is initialized to "1". This accomplishes outputting the last control bit on the first pass through the do . . . while loop, indicting the codeword is complete and no additional data bits follow. Subsequent passes will output controls bits of "0", indicating that additional data bits follow.

The code continues with a do . . . while loop, iteratively outputting bits according to the pattern "x0x0 . . . x1". In one or more of the various embodiments, bits are encoded with the least significant digit in the rightmost position (i.e. just to the left of the "1" control bit).

Each iteration outputs two bits—the first bit (representing a "0" or a "1" in the pattern) is a control bit, and is output in the least significant (rightmost) position. The second bit (representing an "x" in the pattern) is part of the rawcode, and is output to the left of the control bit. Note that, because for ISS(1,1), c1==0, the "+c1" term, which would otherwise be included in each iteration of the do . . . while loop, is omitted as an optimization.

The do . . . while loop continues while "value !=1", or alternatively (and equivalently) while "value>=2".

The following listings implement two example embodiments of a C language implementation of an encoder based on equation (8), "0/rawcode=(value+1)−c2", for ISS (1,1). First:
// range of ints (value): −1 to −2, −3 to −6, −7 to −14, . . .
value ^=−1
// range of ints (value): 0-1, 2-5, 6-13, 14-29, 30-62, . . .
++value;
// range of ints (value): 1-2, 3-6, 7-14, 15-30, 31-63, . . .
token=1<<31;
bit=1;
do {
    AppendBitToToken( ); //'1' on 1st pass, then '0's . . .
    −−value;
    GetBitFromValue_AppendBitToToken( );
} while (value !=0); // "while (value>=1)" is ok too.
// value has been coded into codeword This implementation echoes the implementation of equation (7) for ISS(1,1) discussed above, with the following differences. The body of the do . . . while loop includes "−−value", implementing the "−c2" term, as c2 for ISS(1,1) is known to be "1". Instead of incrementing "value" twice, "value" is only incremented once, implementing the "+1" term.

Another efficient variant of an encoder based on equation (8), "0/rawcode=(value+1)−c2", for ISS (1,1), is:
// range of ints (value): −1 to −2, −3 to −6, −7 to −14, . . .
value ^=−1
// range of ints (value): 0-1, 2-5, 6-13, 14-29, 30-62, . . .
token=1<<31;
bit=1;
do {
    AppendBitToToken( ); //'1' on 1st pass, then '0's . . .
    GetBitFromValue_AppendBitToToken( );
} while ((signed)−−value>=0);
// value has been coded into codeword The following listing includes one example implementation of an encoder based on equation (7) and two example implementations of an encoder based on equation (8) for ISS (1,1) in 80386+ assembly language:

```
(1st version: "1/rawcode = (value + 2) + c1")              eq. (7)
; range of ints (ecx): -1 to -2, -3 to -6, -7 to -14, . . .
not    ecx
; range of ints (ecx): 0-1, 2-5, 6-13, 14-29, 30-62, . . .
inc    ecx
; range of ints (ecx): 1-2, 3-6, 7-14, 15-30, 31-63, . . .
inc    ecx
; range of ints (ecx): 2-3, 4-7, 8-15, 16-31, 32-64, . . .
mov    al, 3
shl    eax, 31 ; make eax = 80000000h, and set CY flag
.repeat
       ; CY flag MUST be zero here from 2nd pass up. .
       call  AppendBitToToken_GetBitFromValue_AppendBitToToken
.until ecx == 1 ; ".until ecx < 2" is ok too. MUST reset CY flag.
; value has been coded into codeword
(2nd version: "0/rawcode = (value + 1) - c2")              eq. (8)
; range of ints (ecx): -1 to -2, -3 to -6, -7 to -14, . . .
not    ecx
; range of ints (ecx): 0-1, 2-5, 6-13, 14-29, 30-62, . . .
inc    ecx
; range of ints (ecx): 1-2, 3-6, 7-14, 15-30, 31-63, . . .
mov    al, 3
shl    eax, 31 ; make eax = 80000000h, and set CY flag
.repeat
       ; CY flag MUST be zero here from 2nd pass up. .
       dec   ecx   ; does not modify CY flag
       call  AppendBitToToken_GetBitFromValue_AppendBitToToken
       test  ecx, ecx   ;this resets CY flag
.until zero? ; ".until ecx < 1" is ok too. MUST reset CY flag.
; value has been coded into codeword
;Another more efficient variant of the 2nd version is:
; range of ints (ecx): -1 to -2, -3 to -6, -7 to -14, . . .
not    ecx
; range of ints (ecx): 0-1, 2-5, 6-13, 14-29, 30-62, . . .
mov    al, 3
shl    eax, 31 ; make eax = 80000000h, and set CY flag
.repeat
       ; CY flag MUST be zero here from 2nd pass up. .
       call  AppendBitToToken_GetBitFromValue_AppendBitToToken
       dec   ecx   ; does not modify CY flag
.until sign?
; value has been coded into codeword
       ;but if this variant is used, then "AppendBitToToken" would
       ;need to be changed so that it ALWAYS resets the CY flag.
       ;(see (*)"AppendBitToToken" above)
```

The following are example implementations of an encoder for ISS(2,2). Codewords encoded using ISS(2,2) are formatted according to the following table. This is but one embodiment, and other embodiments with more or fewer start codes and/or step codes are similarly contemplated:

| range of integers | codewords |
|---|---|
| 0-3 | xx1 |
| 4-19 | xx0xx1 |
| 20-83 | xx0xx0xx1 |
| 84-339 | xx0xx0xx0xx1 |

In this embodiment, according to the derivation above, c1 is known to be "0b10" or 2, while c2 is known to be "0b01" or 1. As such, one C language implementation of an encoder based on equation (7), "1/rawcode=(value+2)+c1" is:

```
// range of ints (value): -1 to -4, -5 to -20, -21 to -84, . . .
value ^=-1;
// range of ints (value): 0-3, 4-19, 20-83, 84-339, . . .
++value;
// range of ints (value): 1-4, 5-20, 21-84, 85-340, . . .
++value;
// range of ints (value): 2-5, 6-21, 22-85, 86-341, . . .
token=1<<31;
bit=1;
do {
  AppendBitToToken( ); //'1' on 1st pass, then '0's . . .
  value+=2;
  GetBitFromValue_AppendBitToToken( ); // 2 times
  GetBitFromValue_AppendBitToToken( ); //
} while (value !=1); // "while (value>=2)" is ok too.
// value has been coded into codeword
```

This implementation echoes the implementation of equation (7) for ISS(1,1) described above. One difference is that, because <step>=2, there are two rawcode bits preceding each control bit, and so within the do . . . while loop there are two calls to "GetBitFromValue_AppendBitToToken". Another difference is that, because c1=2, "+c1" is implemented as "value+=2;". This statement is executed for each iteration of the loop, and as such the conversion from value to codeword is performed incrementally, without storing or accumulating values in temporary variables.

One example C language implementation of an encoder based on equation (8), "0/rawcode=(value+1)−c2", for ISS (2,2) is:

```
// range of ints (value): -1 to -4, -5 to -20, -21 to -84, . . .
value ^=-1;
// range of ints (value): 0-3, 4-19, 20-83, 84-339, . . .
++value;
// range of ints (value): 1-4, 5-20, 21-84, 85-340, . . .
token=1<<31;
bit=1;
do {
  AppendBitToToken( ); //'1' on 1st pass, then '0's . . .
  --value;
  GetBitFromValue_AppendBitToToken( ); // 2 times
  GetBitFromValue_AppendBitToToken( ); //
} while (value !=0); // "while (value>=1)" is ok too.
// value has been coded into codeword
```

Similar to the implementation above, "GetBitFromValue_AppendBitToToken" is executed twice in the do . . . while loop because each step includes two data bits. However, as c2 is known to be "1", "value" is decremented once within the do . . . while loop. Similarly, prior to the do . . . while loop, "value" is only incremented once in accordance with equation (8).

Another efficient variant of an encoder based on equation (8), "0/rawcode=(value+1)−c2", for ISS (2,2), is:

```
// range of ints (value): -1 to -4, -5 to -20, -21 to -84, . . .
value ^=-1;
// range of ints (value): 0-3, 4-19, 20-83, 84-339, . . .
token=1<<31;
bit=1;
do {
  AppendBitToToken( ); //'1' on 1st pass, then '0's . . .
  GetBitFromValue_AppendBitToToken( ); // 2 times
  GetBitFromValue_AppendBitToToken( ); //
} while ((signed)--value>=0);
// value has been coded into codeword
```

The following listing includes one implementation of an encoder based on equation (7) and two implementations of an encoder based on equation (8) for ISS (2,2) in 80386+ assembly language:

```
(1st version: "1/rawcode = (value + 2) + c1")                          eq. (7)
; range of ints (ecx): −1 to −4, −5 to −20, −21 to −84, . . .
not     ecx
; range of ints (ecx): 0-3, 4-19, 20-83, 84-339, . . .
inc     ecx
; range of ints (ecx): 1-4, 5-20, 21-84, 85-340, . . .
inc     ecx
; range of ints (ecx): 2-5, 6-21, 22-85, 86-341, . . .
mov     al, 3
shl     eax, 31 ; make eax = 80000000h, and set CY flag
.repeat
    inc   exc    ; does not modify CY flag
    inc   exc    ; does not modify CY flag
    ; CY flag MUST be zero here from the 2nd pass up. .
    call  AppendBitToToken_GetBitFromValue_AppendBitToToken
    call  GetBitFromValue_AppendBitToToken
.until ecx == 1 ; ".until ecx < 2" is ok too. MUST reset CY flag.
; value has been coded into codeword
(2nd version: "0/rawcode = (value + 1) − c2")                          eq. (8)
; range of ints (ecx): −1 to −4, −5 to −20, −21 to −84, . . .
not     ecx
; range of ints (ecx): 0-3, 4-19, 20-83, 84-339, . . .
inc     ecx
; range of ints (ecx): 1-4, 5-20, 21-84, 85-340, . . .
mov     al, 3
shl     eax, 31 ; make eax = 80000000h, and set CY flag
.repeat
    ; CY flag MUST be zero here from 2nd pass up. .
    dec   ecx    ; does not modify CY flag
    call  AppendBitToToken_GetBitFromValue_AppendBitToToken
    call  GetBitFromValue_AppendBitToToken
    test  ecx, ecx  ;this resets CY flag
.until zero? ; ".until ecx < 1" is ok too. MUST reset CY flag.
; value has been coded into codeword
;Another more efficient variant of the 2nd version is:
; range of ints (ecx): −1 to −4, −5 to −20, −21 to −84, . . .
not     ecx
; range of ints (ecx): 0-3, 4-19, 20-83, 84-339, . . .
mov     al, 3
shl     eax, 31 ; make eax = 80000000h, and set CY flag
.repeat
    ; CY flag MUST be zero here from 2nd pass up. .
    call  AppendBitToToken_GetBitFromValue_AppendBitToToken
    call  GetBitFromValue_AppendBitToToken
    dec   ecx    ; does not modify CY flag
.until sign?
; value has been coded into codeword
;but if this variant is used, then "AppendBitToToken" would
;need to be changed so that it ALWAYS resets the CY flag.
;(see (*)"AppendBitToToken" above)
```

At block 1010, encoded/decoded data is flushed to an output stream, before control continues to a return block.

Figure 11:
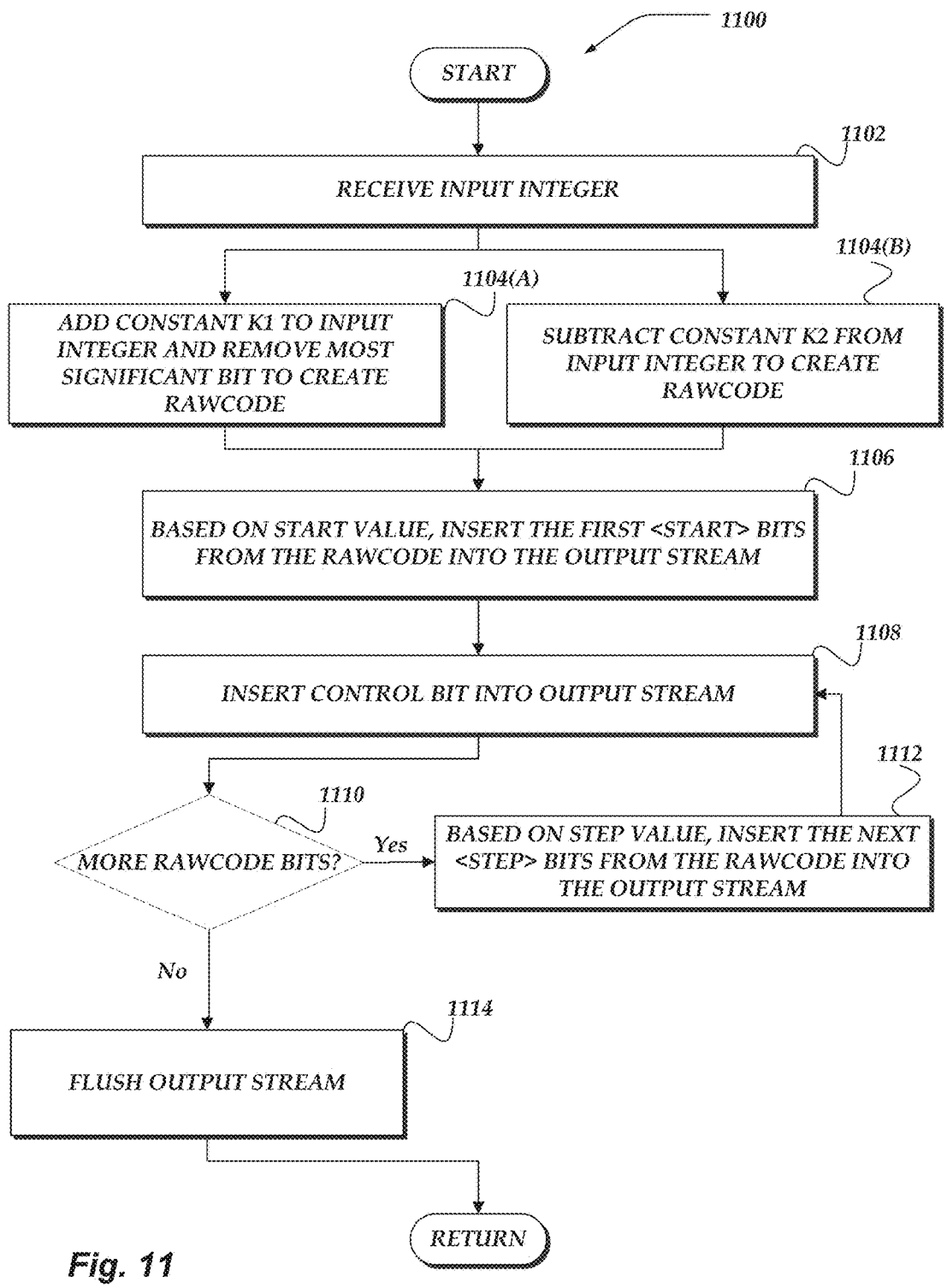
FIG. 11 illustrates a flowchart for a process for encoding an integer into a rawcode and iteratively inserting portions of the rawcode, interleaved with control bits, into an output stream.

FIG. 11 illustrates a flowchart 1100 for a process for encoding an integer into a rawcode and iteratively inserting portions of the rawcode, interleaved with control bits, into an output stream.

After a start block, the process begins at block 1102, where an input integer is received. In one or more of the various embodiments, the input integer may be derived from a character, extracted from a binary blob, or the like.

Blocks 1104(A) and 1104(B) may be executed in the alternative—each step generates equivalent results. Preference may be given to one or the other based on optimizations, hardware requirements, or the like, afforded by the differences. Block 1104(A) implements equation (1), discussed above with regard to FIG. 10, adding a constant k1 to the input integer, and removing the most significant bit from the result. As discussed above in conjunction with FIG. 10, constant k1 is derived based on the particular interleaved start-step code chosen for the instant encoding.

Alternatively, block 1104(B) implements equation (2) discussed above with regard to FIG. 10, subtracting constant k2 from the input integer, thereby generating the same rawcode as block 1104(A).

At block 1106, based on the start value of the interleaved start-step code, the first <start> bits from the rawcode are inserted into an output stream. In embodiments where the "start" code is 0, nothing is inserted into the output stream.

At block 1108, a control bit is inserted into the output stream. In one embodiment, a control bit of 0 indicates that more rawcode data bits are to follow, while a control bit of 1 indicates that the most recently processed rawcode data bits are the last.

At decision block 1110, a determination is made whether additional rawcode data bits exist. In one or more of the various embodiments, if the control bit inserted by block 1108 is a 0, it may indicate that additional data bits exist, and control passes to block 1112. However, if the control bit extracted by block 1108 is a 1, it may indicate that additional data bits do not exist, and control passes to block 1114.

At block 1112, based on the step portion of the interleaved start-step code associated with the input integer, <step> bits from the rawcode are added to the output stream, after which control proceeds to block 1108.

At block 1114, the output stream is flushed and control passes to a return block.

Figure 12:
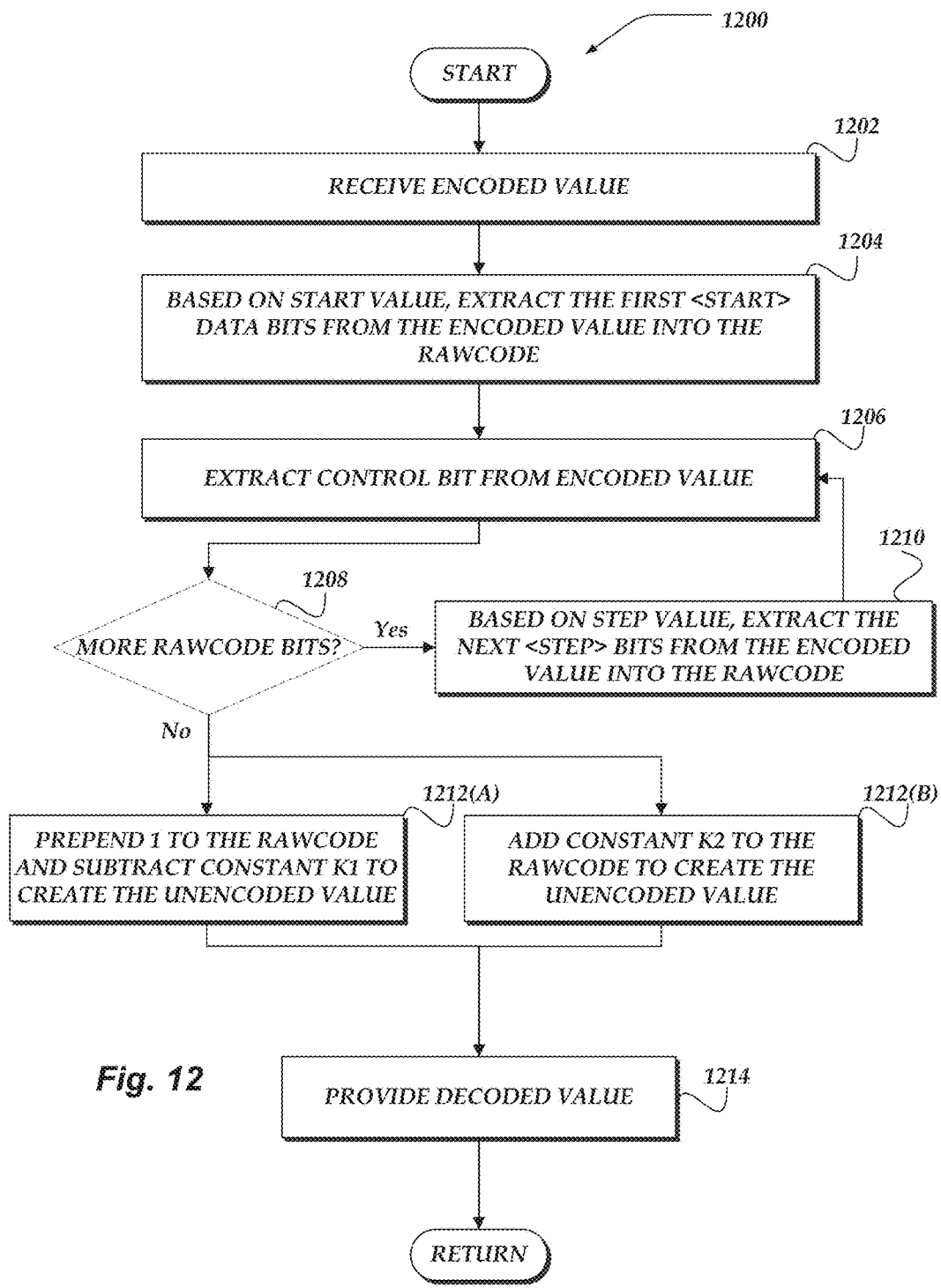
FIG. 12 illustrates a flowchart for a process for extracting a rawcode from an encoded value and decoding the extracted rawcode to produce an integer value.

FIG. 12 illustrates a flowchart for process 1200 for extracting a rawcode from an encoded value and decoding the extracted rawcode to produce an integer value in accordance with one or more of the various embodiments. In one or more of the various embodiments, process 1200 may be performed by an interleaved start-step encoding engine, such as, interleaved start-step encoding engine 322. After a start block, at block 1202, an encoded value is received. The encoded value may be encoded with an interleaved start-step code, as described above in conjunction with FIG. 7. In one or more of the various embodiments, the encoded value is associated with a specific interleaved start-step code.

At block 1204, in one or more of the various embodiments, a rawcode may be created, at least in part, based on the start value of the interleaved start-step code where the first <start> bits are extracted from the encoded value and added to the rawcode. In one embodiment, when the "start" code is 0, this step may be skipped or otherwise omitted.

At block 1206, a control bit is extracted from the encoded value. The control bit is subsequent to the most recently extracted data bits.

At decision block 1208, a determination is made whether additional rawcode data bits exist. In one or more of the various embodiments, if the control bit extracted by block 1206 is a 0, it indicates that additional data bits exist, and control passes to block 1210. However, if the control bit extracted by block 1206 is a 1, it indicates that additional data bits do not exist, and control passes to block 1212(A) or 1212(B).

At block 1210, additional data bits are extracted from the encoded value and appended to the rawcode. In one or more of the various embodiments, the number of additional data bits extracted is based on the step portion of the interleaved start-step code. Specifically, <step> bits from the encoded value are extracted and appended to the rawcode. Upon completion, control passes back to block 1206.

Blocks 1212(A) and 1212(B) can be executed in the alternative—either block provides the same result. At block 1212(A), equation (3) as discussed above with regard to FIG. 10 is implemented by prepending a 1 to the rawcode, and subtracting offset constant k1, to generate the unencoded value. In one or more of the various embodiments, as discussed above with regard to FIG. 10, k1 is derived from the interleaved start-step code defined for this encoded value. Producing the same result, block 1212(B) implements equation (4) discussed above with regard to FIG. 10, adding the offset constant k2 to the rawcode to generate the unencoded value.

At block 1214, the decoded value may be provided. In some embodiments, the decoded value may be stored in a memory location accessible to calling processes or functions. In some embodiments, the decoded value may be communicated to a caller via a communication protocol via a bus or network.

Next, control may be returned to a calling process.

Figure 13:
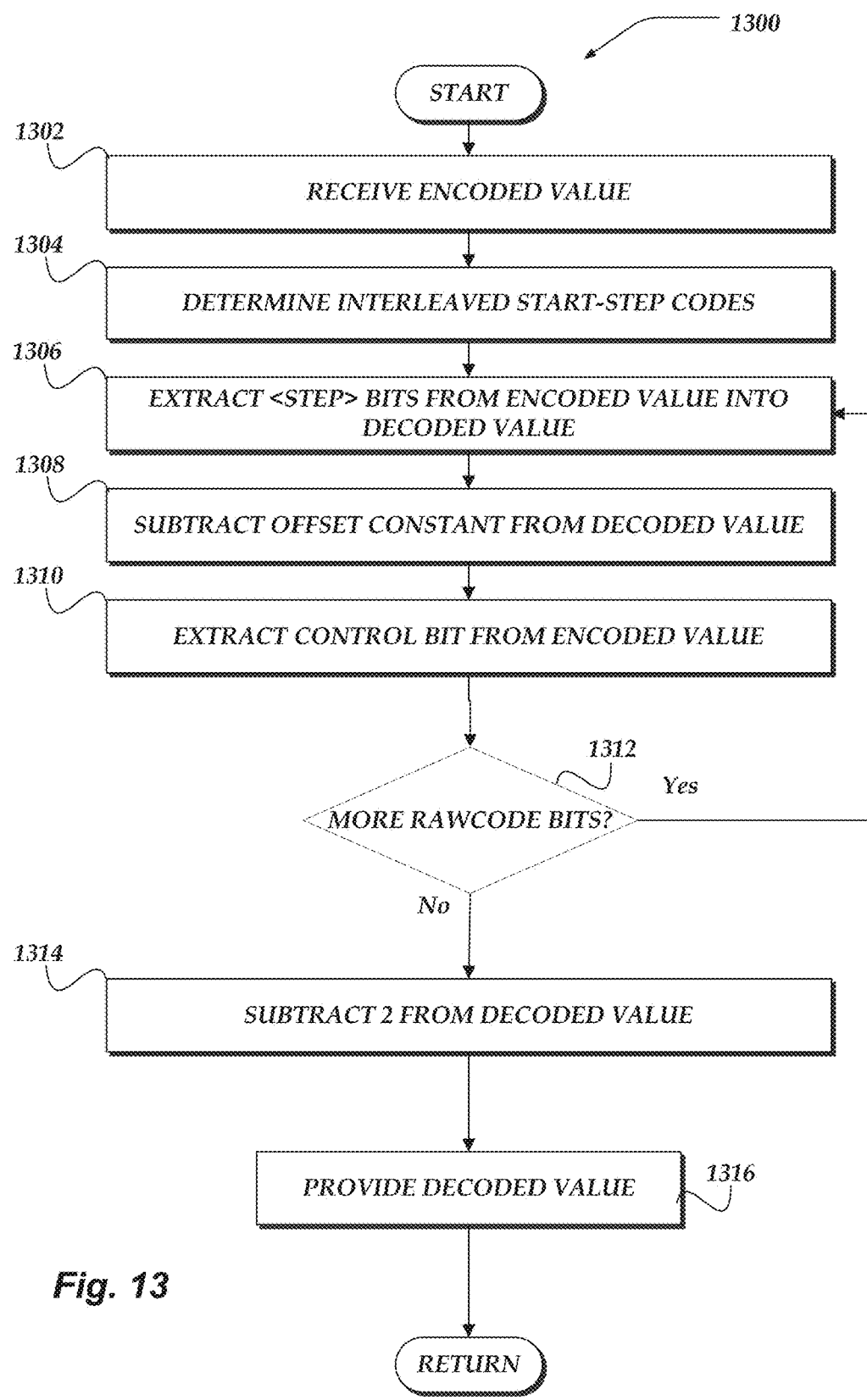
FIG. 13 illustrates an overview flowchart for interleaved start-step decoding in accordance with one or more of the various embodiments.

FIG. 13 illustrates an overview flowchart for process 1300 for interleaved start-step decoding using constants c1 or c2, instead of k1 or k2, in accordance with one or more of the various embodiments. Process 1300 may be implemented and executed by, for example, network computer 116 as depicted by network computer 300 of FIG. 3. However, other computers, including client computers 102-104 as depicted by client computer 200 of FIG. 2, are also performing the operations described below in conjunction with FIG. 13.

After a start block, at block 1302, an encoded value, i.e. a codeword, is received. In one or more of the various embodiments, the encoded value may be in the form of a series of bits. Additionally or alternatively, the encoded value may be byte or word or integer aligned in memory, or it may not be byte or word or integer aligned in memory. The encoded value may be contained in a single integer, or span multiple integers.

In general, codewords encoded using ISS(n,n) are formatted according to the following table. This is but one embodiment, and other embodiments with more or fewer start codes and/or step codes are similarly contemplated:

| range of integers | codewords |
| --- | --- |
| 0-2 ^ n − 1 | x..x1 |
| 2 ^ n-2 ^ (2n) + 2 ^ n − 1 | x..x0x..x1 |
| 2 ^ (2n) + 2 ^ n-2 ^ (3n) + 2 ^ (2n) + 2 ^ n − 1 | x..x0x..x0x..x1 |
| 2 ^ (3n) + 2 ^ (2n) + 2 ^ n-2 ^ (4n) + 2 ^ (3n) + | x..x0x..x0x..x0x..x1 |
| 2 ^ (2n) + 2 ^ n − 1 | |

At block 1304, interleaved start-step codes are determined for the received codeword. For example, a start-step code of (3,3) may be received. The interleaved start-step codes may be known by convention, they may be received with the codeword, or they may be received as user input.

Once the appropriate "step" code is received, the corresponding c1 value is determined, as discussed above in conjunction with FIG. 10. Continuing the example, for a start-step code of (3,3), c1=0b110 and c2=0b001.

Blocks 1306 through 1316 describe a decoder implemented in the C language based on equation (9), as listed below. In this implementation, n represents the step code (i.e. <step>), and m represents c1. The listing will be made reference to by line number:

```
1  #define n ?
2  #define m ((1<<n) − 2) //(2 ^ n − 2) (0, 10, 110, 1110, ..)
3  value = 1;
4  do {
5      GetBitFromToken_AppendBitToValue( ); //
6          .                                // n times..
7          .                                //
8      GetBitFromToken_AppendBitToValue( ); //
9      value −= m;
10     GetBitFromToken( );
11 } while (bit == 0);
12 value −= 2;
13 // range of ints (value): depends on 'n' (see table above)..
```

This implementation generalizes the implementations of equation (9) for ISS(1,1) and ISS(2,2) described above in conjunction with FIG. 10.

At block 1306, a do ... while loop begins on line 4. Lines 5-8 depict invoking "GetBitFromToken_AppendBitToValue" "n" times (i.e. <step> times), thereby extracting <step> bits from the encoded value and copying them into the decoded "value" variable.

At block 1308, line 9 depicts adjusting "value" during each iteration by subtracting "m" (i.e. subtracting c1).

At block 1310, line 10 calls "GetBitFromToken( )", to extract the control bit from the encoded value.

At block 1312, line 11 depicts determining if more rawcode bits exist in the encoded value based on the extracted control bit. In one embodiment, if the control bit is "0", then the do ... while loop iterates again, and control flows to block 1306. However, if the control bit is "1", then the do ... while loop terminates, and control flows to block 1314.

At block 1314, 2 is subtracted from "value", leaving the decoded value in the "value" variable. In this embodiment, 2 is subtracted according to equation (9), and applies to all permutations of start and step parameters.

At block 1316, the decoded value may be provided. In some embodiments, the decoded value may be stored in a memory location accessible to calling processes or functions. In some embodiments, the decoded value may be communicated to a caller via a communication protocol via a bus or network.

Next, control may be returned to a calling process.

FIG. 13 depicts one implementation of a decoder based on equation (9). Below is a listing of another decoder, this one based on equation (10):

```
#define n ?
value = 0;
do {
    GetBitFromToken_AppendBitToValue( );    //
        .                                    // n times. .
        .                                    //
    GetBitFromToken_AppendBitToValue( );    //
    ++ value;
    GetBitFromToken( );
} while (bit == 0);
−−value;
// range of ints (value): depends on 'n' (see table above). .
```

This decoder is similar to the decoder based on equation (9) listed above. "GetBitFromToken_AppendBitToValue" is executed "n" times in a do ... while loop because there are similarly "n" data bits preceding each control bit. However, c2 is known to be "1" for all values of n, and so value is incremented (i.e. "++value;") within the do ... while loop instead of being decremented by "m". Similarly, after the do ... while loop, "value" is only decremented once in accordance with equation (10).

The following listing includes one implementation of a decoder based on equations (9) and (10) for ISS (n,n) in 80386+ assembly language:

```
(1st version: "value = (1/rawcode − c1) − 2")                eq. (9)
n       equ     ?
m       equ     (1 shl n) − 2 ;(2^n − 2) (0, 10, 110, . . .)
        xor     ecx, ecx
        inc     ecx
.repeat
        call    GetBitFromToken_AppendBitToValue        ;
                .                                       ; n times. .
                .                                       ;
                .
        call    GetBitFromToken_AppendBitToValue        ;
        sub     ecx, m
        call    GetBitFromToken
.until  carry?
dec     ecx
dec     ecx
; range of ints (ecx): depends on 'n' (see table above). .
(2nd version: "value = (0/rawcode + c2) − 1")                eq. (10)
n       equ     ?
xor     ecx, ecx
.repeat
        call    GetBitFromToken_ AppendBitToValue_GetBitFromToken
        call    AppendBitToValue_GetBitFromToken        ;
                .                                       ; (n − 1) times. .
                .                                       ;
                .
        call    AppendBitToValue_GetBitFromToken        ;
        inc     ecx
.until  carry?
dec     ecx
; range of ints (ecx): depends on 'n' (see table above). .
```

Figure 14:
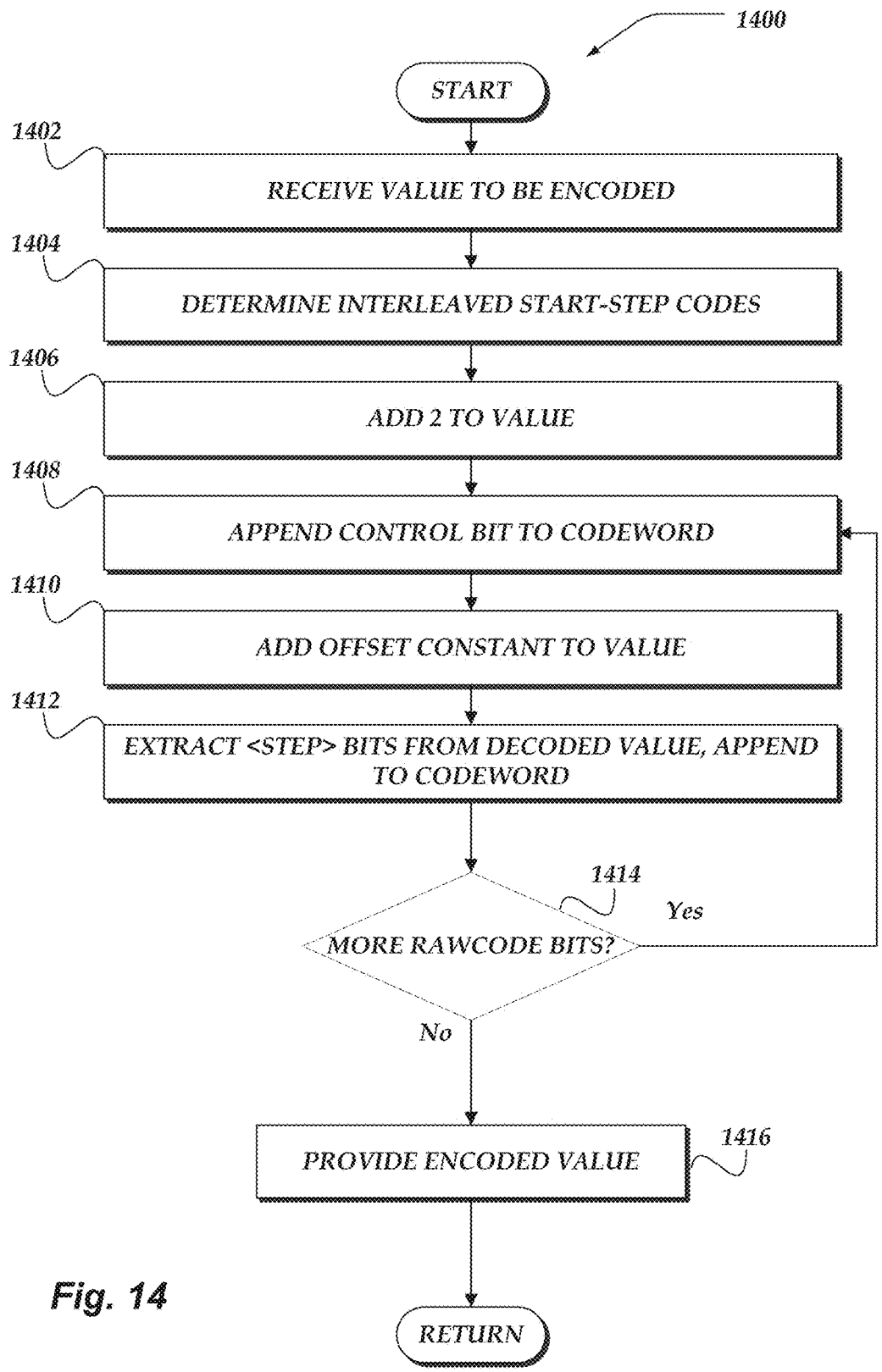
FIG. 14 illustrates an overview flowchart for interleaved start-step encoding in accordance with one or more of the various embodiments.

FIG. 14 illustrates an overview flowchart for process 1400 for interleaved start-step encoding in accordance with one or more of the various embodiments. Process 1400 may be implemented and executed by, for example, network computer 116 as depicted by network computer 300 of FIG. 3. However, other computers, including client computers 102-105 as depicted by client computer 200 of FIG. 2, are also performing the operations described below in conjunction with FIG. 14.

After a start block, at block 1402, a value to be encoded, e.g. an integer or other source symbol, is received. In one or more of the various embodiments, the value to be encoded may be in the form of a series of bits. Additionally or alternatively, The value to be encoded may be contained in a single integer, or span multiple integers.

In general, codewords encoded using ISS(n,n) are formatted according to the following table. This is but one embodiment, and other embodiments with more or fewer start codes and/or step codes are similarly contemplated:

| range of integers | codewords |
|---|---|
| 0-2^n − 1 | x..x1 |
| 2^n-2 (2n) + 2^n − 1 | x..x0x..x1 |
| 2^(2n) + 2^n-2 (3n) + 2^(2n) + 2^n − 1 | x..x0x..x0x..x1 |
| 2^(3n) + 2^(2n) + 2^n-2 (4n) + 2^(3n) + | x..x0x..x0x..x0x..x1 |
| 2^(2n) + 2^n − 1 | |

At block 1404, interleaved start-step codes are determined for the received value. For example, a start-step code of (3,3) may be received. The interleaved start-step codes may be known by convention, they may be received with the codeword, or they may be received as user input.

Once the appropriate "step" code is received, the corresponding c1 value is determined, as discussed above in conjunction with FIG. 10. Continuing the example, for a start-step code of (3,3), c1=0b110 and c2=0b001.

Blocks 1406 through 1416 describe an encoder implemented in the C language based on equation (7), as listed below. In this implementation, n represents the step code (i.e. <step>), and m represents c1. The listing will be made reference to by line number:

```
1  #define n ?
2  #define m ((1<<n) − 2) //(2 ^ n − 2) (0, 10, 110, 1110, ..)
3  // range of ints (value): depends on 'n' (see table above)..
4  value += 2;
5  token = 1 << 31;
6  bit = 1;
7  do {
8      AppendBitToToken( ); //'1'on 1st pass, then '0's..
9      value += m;
10     GetBitFromValue_AppendBitToToken( ); //
11     .                                    // n times..
12     .                                    //
13     GetBitFromValue_AppendBitToToken( ); //
14  } while (value != 1); // "while (value >= 2)" is ok too.
15  // value has been coded into codeword
```

This implementation generalizes the implementations of equation (7) for ISS(1,1) and ISS(2,2) described above in conjunction with FIG. 10.

At block 1406, 2 is added to the value to be encoded. In this embodiment, 2 is added according to equation (7), and applies to all permutations of start and step parameters.

At block 1408, a do . . . while loop begins on line 7. Line 8 depicts appending a control bit to the codeword. The variable "bit" has been initialized to 1 on line 6, but will be 0 on subsequent iterations, and so the initial loop iteration will output a control bit of 1, while subsequent iterations will output a control bit of 0. From this it can be seen that the least significant digits of the rawcode are emitted first (after the control bit set to "1"), and as additional data bits and control bits are added, the existing bits are shifted right.

At block 1410, line 9 depicts adjusting "value" during each iteration by adding "m" (i.e. subtracting c1).

At block 1412, lines 10-13 depict invoking "GetBitFromValue_AppendBitToToken" "n" times (i.e. <step> times), thereby extracting <step> bits from the value to be encoded and copying them into the encoded "value" variable.

At block 1414, a determination is made whether the value to be encoded has been completely encoded or not. In one or more of the various embodiments, if "value" !=1, then there are additional data bits in the value to be encoded, and so another iteration of the do . . . while loop is executed, and control continues to block 1408. However, if "value"==1, then all of the data bits have been encoded, so the do . . . while loop terminates.

At block 1416, the encoded value may be provided. In some embodiments, the encoded value may be stored in a memory location accessible to calling processes or functions. In some embodiments, the encoded value may be communicated to a caller via a communication protocol via a bus or network.

Next, control may be returned to a calling process.

FIG. 14 depicts one implementation of an encoder based on equation (7). Below is a listing of another decoder, this one based on equation (8) ("0/rawcode=(value+1)−c2"):

```
#define n ?
// range of ints (value): depends on 'n' (see table
    above) . . .
++value;
token=1<<31;
bit=1;
do {
    AppendBitToToken( );  //'1' on 1st pass, then
        '0's . . .
    --value;
    GetBitFromValue_AppendBitToToken( ); //
    • // n times . . .
    • //
    GetBitFromValue_AppendBitToToken( ); //
```

} while (value !=0); // "while (value>=1)" is ok too.
// value has been coded into codeword This encoder is similar to the encoder based on equation (7) listed above. "GetBitFromValue_AppendBitToToken" is executed "n" times in the do . . . while loop because there are "n" data bits for each control bit. However, as c2 is known to be "1" for all values of n (see table above), "value" is decremented within the do . . . while loop, instead of being subtracted by "m". Similarly, prior to the do . . . while loop, "value" is only incremented once in accordance with equation (8).

The following listing includes another efficient variant of an encoder based on equation (8), "0/rawcode=(value+1)−c2", for ISS (n,n):

```
#define n ?
// range of ints (value): depends on 'n' (see table
    above) . . .
token=1<<31;
bit=1;
do {
    AppendBitToToken( ); //'1' on 1st pass, then '0's . . .
    GetBitFromValue_AppendBitToToken( ); //
    • // n times . . .
    • //
    GetBitFromValue_AppendBitToToken( ); //
} while ((signed)--value>=0);
// value has been coded into codeword
```

The following listing includes one implementation of an encoder based on equation (7) and two implementations of an encoder based on equation (8) for ISS (n,n) in 80386+ assembly language:

```
(1st version: "1/rawcode = (value + 2) + c1")              eq. (7)
n           equ     ?
m           equ     (1 shl n) − 2 ;(2^n − 2) (0, 10, 110, ..)
; range of ints (ecx): depends on 'n' (see table above). .
inc         ecx
inc         ecx
mov         al, 3
shl         eax, 31 ; make eax = 80000000h, and set CY flag
.repeat
    ; CY flag MUST be zero here from the 2nd pass up. .
    call        AppendBitToToken
    add         ecx, m
    call        GetBitFromValue_AppendBitToToken       ;
    .                                                  ; n times. .
    .                                                  ;
    call        GetBitFromValue_AppendBitToToken       ;
.until ecx == 1 ; ".until ecx < 2" is ok too. MUST reset CY flag.
; value has been coded into codeword
(2nd version: "0/rawcode = (value + 1) − c2")              eq. (8)
n           equ     ?
; range of ints (ecx): depends on 'n' (see table above). .
inc         ecx
mov         al, 3
shl         eax, 31 ; make eax = 80000000h, and set CY flag
.repeat
    ; CY flag MUST be zero here from 2nd pass up. .
    dec     ecx     ; does not modify CY flag
    call        AppendBitToToken_GetBitFromValue_AppendBitToToken
    call        GetBitFromValue_AppendBitToToken       ;
    .                                                  ; n times. .
    .                                                  ;
    call        GetBitFromValue_AppendBitToToken       ;
    test    ecx, ecx    ;this resets CY flag
.until zero? ; ".until ecx < 1" is ok too. MUST reset CY flag.
; value has been coded into codeword
;Another more efficient variant of the 2nd version is:
n           equ     ?
; range of ints (ecx): depends on 'n' (see table above). .
mov         al, 3
shl         eax, 31 ; make eax = 80000000h, and set CY flag
.repeat
    ; CY flag MUST be zero here from 2nd pass up. .
    call        AppendBitToToken_GetBitFromValue_AppendBitToToken
    call        GetBitFromValue_AppendBitToToken       ;
    .                                                  ; n times. .
    .                                                  ;
    call        GetBitFromValue_AppendBitToToken       ;
    dec     ecx     ; does not modify CY flag
.until sign?
; value has been coded into codeword
;but if this variant is used, then "AppendBitToToken" would
;need to be changed so that it ALWAYS resets the CY flag.
;(see (*)"AppendBitToToken" above)
```

What is claimed as new and desired to be protected by Letters Patent of the United States is:

1. A method for encoding data over a network using one or more processors of a network computer that execute instructions to perform the method, comprising:
    instantiating one or more encoding engines to perform actions, including:
        selecting one of a plurality of source symbols based on an input stream of data, wherein each source symbol includes a numerical value;
        generating an offset constant for the source symbol based on a numerical value of a provided start code;
        converting the source symbol to a raw code based on the offset constant and the source symbol's numerical value;
        generating a code word by performing actions, including:
            (1) identifying a position in the raw code based on a numerical value of the start code;
            (2) inserting at the position a control bit; and
            (3) iteratively identifying one or more next positions in the raw code based on a numerical value of the step code until an end of the raw code is reached, wherein additional control bits are inserted at the one or more next positions, and wherein a last control bit is appended to an end of the code word; and
        providing the code word to an output stream.

2. The method of claim 1, wherein the start code defines a number of data bits in the code word before a first control bit is inserted, and wherein the step code defines a number of data bits found before each subsequent control bit is inserted.

3. The method of claim 1, further comprising:
    employing a zero value of the control bit to indicate there is at least one more control bit in the code word; and
    employing a 1 value of the control bit to indicate the end of the code word.

4. The method of claim 1, wherein converting the source symbol to the raw code, further comprises, subtracting the offset constant from the source symbol's numerical value.

5. The method of claim 1, wherein generating the offset constant further comprises, determining a pattern of the iteration based on the offset constant, wherein the pattern repeats with a same number of bits as the step code.

6. The method of claim 1, wherein the code word represents a copy match offset token generated by a text compression algorithm.

7. The method of claim 1, further comprising:
    monitoring operation of the network; and
    when the operation of the network is less than a threshold, modifying one or more of the start code or the step code; and when the operation of the network is more than the threshold, restoring the modified one or more of the start code or the step code.

8. The method of claim 1, further comprising, instantiating one or more decoding engines to perform actions, including, decoding one or more code words based on performing one or more actions of the one or more encoding engines in a reverse order.

9. A processor readable non-transitory storage media that includes instructions for encoding data over a network using one or more network computers, wherein execution of the instructions by the one or more network computers perform the method comprising:
  instantiating one or more encoding engines to perform actions, including:
    selecting one of a plurality of source symbols based on an input stream of data, wherein each source symbol includes a numerical value;
    generating an offset constant for the source symbol based on a numerical value of a provided start code;
    converting the source symbol to a raw code based on the offset constant and the source symbol's numerical value;
    generating a code word by performing actions, including:
      (1) identifying a position in the raw code based on a numerical value of the start code;
      (2) inserting at the position a control bit; and
      (3) iteratively identifying one or more next positions in the raw code based on a numerical value of the step code until an end of the raw code is reached, wherein additional control bits are inserted at the one or more next positions, and wherein a last control bit is appended to an end of the code word; and
    providing the code word to an output stream.

10. The media of claim 9, wherein the start code defines a number of data bits in the code word before a first control bit is inserted, and wherein the step code defines a number of data bits found before each subsequent control bit is inserted.

11. The media of claim 9, further comprising:
  employing a zero value of the control bit to indicate there is at least one more control bit in the code word; and
  employing a 1 value of the control bit to indicate the end of the code word.

12. The media of claim 9, wherein converting the source symbol to the raw code, further comprises, subtracting the offset constant from the source symbol's numerical value.

13. The media of claim 9, wherein generating the offset constant further comprises, determining a pattern of the iteration based on the offset constant, wherein the pattern repeats with a same number of bits as the step code.

14. The media of claim 9, wherein the code word represents a copy match offset token generated by a text compression algorithm.

15. The media of claim 9, further comprising:
  monitoring operation of the network; and
  when the operation of the network is less than a threshold, modifying one or more of the start code or the step code; and
  when the operation of the network is more than the threshold, restoring the modified one or more of the start code or the step code.

16. The media of claim 9, further comprising, instantiating one or more decoding engines to perform actions, including, decoding one or more code words based on performing one or more actions of the one or more encoding engines in a reverse order.

17. A system for encoding data, comprising:
  one or more network computers, comprising:
    a transceiver that communicates over a network;
    a memory that stores at least instructions; and
    one or more processors that execute instructions that perform actions, including:
      instantiating one or more encoding engines to perform actions, including:
        selecting one of a plurality of source symbols based on an input stream of data, wherein each source symbol includes a numerical value;
        generating an offset constant for the source symbol based on a numerical value of a provided start code;
        converting the source symbol to a raw code based on the offset constant and the source symbol's numerical value;
        generating a code word by performing actions, including:
          (1) identifying a position in the raw code based on a numerical value of the start code;
          (2) inserting at the position a control bit; and
          (3) iteratively identifying one or more next positions in the raw code based on a numerical value of the step code until an end of the raw code is reached, wherein additional control bits are inserted at the one or more next positions, and wherein a last control bit is appended to an end of the code word; and
        providing the code word to an output stream; and
  one or more client computers, comprising:
    a transceiver that communicates over the network;
    a memory that stores at least instructions; and
    one or more processors that execute instructions that perform actions, including:
      providing one or more portions of the input stream.

18. The system of claim 17, wherein the start code defines a number of data bits in the code word before a first control bit is inserted, and wherein the step code defines a number of data bits found before each subsequent control bit is inserted.

19. The system of claim 17, further comprising:
  employing a zero value of the control bit to indicate there is at least one more control bit in the code word; and
  employing a 1 value of the control bit to indicate the end of the code word.

20. The system of claim 17, wherein converting the source symbol to the raw code, further comprises, subtracting the offset constant from the source symbol's numerical value.

21. The system of claim 17, wherein generating the offset constant further comprises, determining a pattern of the iteration based on the offset constant, wherein the pattern repeats with a same number of bits as the step code.

22. The system of claim 17, wherein the code word represents a copy match offset token generated by a text compression algorithm.

23. The system of claim 17, further comprising:
  monitoring operation of the network; and
  when the operation of the network is less than a threshold, modifying one or more of the start code or the step code; and
  when the operation of the network is more than the threshold, restoring the modified one or more of the start code or the step code.

24. A network computer for encoding data, comprising:
a transceiver that communicates over a network;
a memory that stores at least instructions; and
one or more processors that execute instructions that perform actions, including:
- instantiating one or more encoding engines to perform actions, including:
  - selecting one of a plurality of source symbols based on an input stream of data, wherein each source symbol includes a numerical value;
  - generating an offset constant for the source symbol based on a numerical value of a provided start code;
  - converting the source symbol to a raw code based on the offset constant and the source symbol's numerical value;
  - generating a code word by performing actions, including:
    (1) identifying a position in the raw code based on a numerical value of the start code;
    (2) inserting at the position a control bit; and
    (3) iteratively identifying one or more next positions in the raw code based on a numerical value of the step code until an end of the raw code is reached, wherein additional control bits are inserted at the one or more next positions, and wherein a last control bit is appended to an end of the code word; and
  - providing the code word to an output stream.

25. The network computer of claim 24, wherein the start code defines a number of data bits in the code word before a first control bit is inserted, and wherein the step code defines a number of data bits found before each subsequent control bit is inserted.

26. The network computer of claim 24, further comprising:
- employing a zero value of the control bit to indicate there is at least one more control bit in the code word; and
- employing a 1 value of the control bit to indicate the end of the code word.

27. The network computer of claim 24, wherein converting the source symbol to the raw code, further comprises, subtracting the offset constant from the source symbol's numerical value.

28. The network computer of claim 24, wherein generating the offset constant further comprises, determining a pattern of the iteration based on the offset constant, wherein the pattern repeats with a same number of bits as the step code.

29. The network computer of claim 24, wherein the code word represents a copy match offset token generated by a text compression algorithm.

30. The network computer of claim 24, further comprising:
- monitoring operation of the network; and
- when the operation of the network is less than a threshold, modifying one or more of the start code or the step code; and
- when the operation of the network is more than the threshold, restoring the modified one or more of the start code or the step code.

* * * * *